United States Patent
Tsuchiya et al.

(10) Patent No.: US 7,782,575 B2
(45) Date of Patent: Aug. 24, 2010

(54) MAGNETORESISTIVE ELEMENT HAVING FREE LAYER, PINNED LAYER, AND SPACER LAYER DISPOSED THEREBETWEEN, THE SPACER LAYER INCLUDING SEMICONDUCTOR LAYER

(75) Inventors: Yoshihiro Tsuchiya, Tokyo (JP); Kei Hirata, Tokyo (JP); Tomohito Mizuno, Tokyo (JP); Koji Shimazawa, Tokyo (JP)

(73) Assignee: TDK Corporation, Tokyo (JP)

( * ) Notice: Subject to any disclaimer, the term of this patent is extended or adjusted under 35 U.S.C. 154(b) by 840 days.

(21) Appl. No.: 11/698,180

(22) Filed: Jan. 26, 2007

(65) Prior Publication Data

US 2008/0062557 A1 Mar. 13, 2008

(30) Foreign Application Priority Data

Sep. 8, 2006 (JP) ............................. 2006-244678
Oct. 10, 2006 (JP) ............................. 2006-275972

(51) Int. Cl.
G11B 5/39 (2006.01)
(52) U.S. Cl. .................................. 360/324.1
(58) Field of Classification Search ........................ None
See application file for complete search history.

(56) References Cited

U.S. PATENT DOCUMENTS

| 6,074,707 | A | 6/2000 | Nakazawa et al. | |
|---|---|---|---|---|
| 6,115,224 | A | 9/2000 | Saito | |
| 6,781,798 | B2 * | 8/2004 | Gill | 360/314 |
| 7,006,337 | B2 * | 2/2006 | Dieny et al. | 360/324 |
| 7,072,153 | B2 | 7/2006 | Koui et al. | |
| 7,075,760 | B2 * | 7/2006 | Gill | 360/324.12 |
| 7,583,481 | B2 * | 9/2009 | Zhang et al. | 360/324.11 |
| 2004/0021990 | A1 | 2/2004 | Koui et al. | |
| 2006/0034022 | A1 | 2/2006 | Fukuzawa et al. | |
| 2006/0060989 | A1 | 3/2006 | Morise et al. | |

(Continued)

FOREIGN PATENT DOCUMENTS

JP A-10-223942 8/1998

(Continued)

OTHER PUBLICATIONS

T. Valet et al., "Theory of Perpendicular Magnetoresistance in Magnetic Multilayers", Physical Review B, The American Physical Society, vol. 48, No. 10, (Sep. 1, 1993) pp. 7099-7113.

(Continued)

*Primary Examiner*—Mark Blouin
(74) *Attorney, Agent, or Firm*—Oliff & Berridge, PLC

(57) ABSTRACT

An MR element includes: a free layer having a direction of magnetization that changes in response to a signal magnetic field; a pinned layer having a fixed direction of magnetization; and a spacer layer disposed between these layers. The spacer layer includes a first nonmagnetic metal layer and a second nonmagnetic metal layer each made of a nonmagnetic metal material, and a semiconductor layer that is made of a material containing an oxide semiconductor and that is disposed between the first and second nonmagnetic metal layers. The MR element has a resistance-area product within a range of 0.1 to $0.3\Omega\cdot\mu m^2$, and the spacer layer has a conductivity within a range of 133 to 432 S/cm.

11 Claims, 8 Drawing Sheets

U.S. PATENT DOCUMENTS

2006/0067017 A1    3/2006    Yuasa et al.

FOREIGN PATENT DOCUMENTS

| JP | A-11-126932 | 5/1999 |
|---|---|---|
| JP | A-2000-132818 | 5/2000 |
| JP | A-2001-320110 | 11/2001 |
| JP | A-2002-084014 | 3/2002 |
| JP | A-2003-008102 | 1/2003 |
| JP | A-2003-298143 | 10/2003 |
| JP | B2 3749873 | 12/2005 |
| JP | A-2006-054257 | 2/2006 |
| JP | A-2006-086476 | 3/2006 |

OTHER PUBLICATIONS

J. Bass et al., "Current-Perpendicular (CPP) Magnetoresistance in Magnetic Metallic Multilayers", Journal of Magnetism and Magnetic Materials 200, (1999) pp. 274-289.

"Technology of Transparent Conductive Film", Edited by Japan Society for the Promotion of Science, The 166th Committee on Transparent Oxides and Photoelectronic Materials (published by Ohmsha, Ltd., 1999) p. 168.

Dec. 17, 2008 Office Action issued in Japanese Patent Application No. 2006-275972 (with translation).

Jun. 29, 2009 Office Action issued in Japanese Patent Application No. 2006-275972 (with translation).

Feb. 2, 2010 Office Action issued in Japanese Patent Application No. 2006-275972 (with translation).

* cited by examiner

MAGNETORESISTIVE ELEMENT HAVING FREE LAYER, PINNED LAYER, AND SPACER LAYER DISPOSED THEREBETWEEN, THE SPACER LAYER INCLUDING SEMICONDUCTOR LAYER

BACKGROUND OF THE INVENTION

1. Field of the Invention

The present invention relates to a magnetoresistive element, and to a thin-film magnetic head, a head gimbal assembly, a head arm assembly and a magnetic disk drive each of which includes the magnetoresistive element.

2. Description of the Related Art

Performance improvements in thin-film magnetic heads have been sought as areal recording density of magnetic disk drives has increased. A widely used type of thin-film magnetic head is a composite thin-film magnetic head that has a structure in which a write head having an induction-type electromagnetic transducer for writing and a read head having a magnetoresistive element (that may be hereinafter referred to as MR element) for reading are stacked on a substrate.

MR elements include AMR (anisotropic magnetoresistive) elements utilizing an anisotropic magnetoresistive effect, GMR (giant magnetoresistive) elements utilizing a giant magnetoresistive effect, and TMR (tunneling magnetoresistive) elements utilizing a tunneling magnetoresistive effect.

Read heads are required to have characteristics of high sensitivity and high output power. As the read heads that satisfy such requirements, GMR heads that employ spin-valve GMR elements have been mass-produced. Recently, to accommodate further improvements in areal recording density, developments have been pursued for read heads employing TMR elements.

A spin-valve GMR element typically includes a free layer, a pinned layer, a nonmagnetic conductive layer disposed between the free layer and the pinned layer, and an antiferromagnetic layer disposed on a side of the pinned layer farther from the nonmagnetic conductive layer. The free layer is a ferromagnetic layer whose direction of magnetization changes in response to a signal magnetic field. The pinned layer is a ferromagnetic layer whose direction of magnetization is fixed. The antiferromagnetic layer is a layer that fixes the direction of magnetization of the pinned layer by means of exchange coupling with the pinned layer.

Conventional GMR heads have a structure in which a current used for detecting magnetic signals (that is hereinafter referred to as a sense current) is fed in the direction parallel to the plane of each layer making up the GMR element. Such a structure is called a CIP (current-in-plane) structure. On the other hand, developments have been pursued for another type of GMR heads having a structure in which the sense current is fed in a direction intersecting the plane of each layer making up the GMR element, such as the direction perpendicular to the plane of each layer making up the GMR element. Such a structure is called a CPP (current-perpendicular-to-plane) structure. A GMR element used for read heads having the CPP structure is hereinafter called a CPP-GMR element. A GMR element used for read heads having the CIP structure is hereinafter called a CIP-GMR element.

Read heads that employ TMR elements mentioned above have the CPP structure, too. A TMR element typically includes a free layer, a pinned layer, a tunnel barrier layer disposed between the free layer and the pinned layer, and an antiferromagnetic layer disposed on a side of the pinned layer farther from the tunnel barrier layer. The tunnel barrier layer is a nonmagnetic insulating layer through which electrons are capable of passing with spins thereof conserved by the tunnel effect. The free layer, the pinned layer and the antiferromagnetic layer of the TMR element are the same as those of the spin-valve GMR element. As compared with the spin-valve GMR element, the TMR element is expected to provide a higher magnetoresistance change ratio (hereinafter referred to as an MR ratio), which is the ratio of magnetoresistance change with respect to the resistance.

JP 2002-84014A discloses a TMR element having a structure in which a second layer made of a nonmagnetic insulating film is sandwiched between a first layer and a third layer each of which is made of a ferromagnetic metal thin film. This TMR element is designed so that the spin polarization of the second layer is one tenth or less that of each of the first layer and the third layer. The second layer is made of a ZnOx thin film (x=0.95 to 1.05) as an insulating film.

JP 2006-86476A discloses a magnetic recording element including: a free layer whose direction of magnetization is changed by the action of spin-polarized electrons; a pinned layer whose direction of magnetization is fixed; and an intermediate layer made of a nonmagnetic material and provided between the pinned layer and the free layer. JP 2006-86476A lists a nonmagnetic metal, an insulating material and a semiconductor material as the material of the intermediate layer. In this magnetic recording element, the direction of magnetization of the free layer is changed by injecting spin-polarized electrons into the free layer.

JP 2006-54257A discloses a CPP-GMR element including: a magnetization pinned layer whose direction of magnetization is pinned; a magnetization free layer whose direction of magnetization changes in response to an external magnetic field; and a spacer layer disposed between the magnetization pinned layer and the magnetization free layer, the spacer layer including an insulating layer and current paths penetrating the insulating layer. In this CPP-GMR element, the insulating layer is made of $Al_2O_3$, for example, and the current paths are made of Cu, for example. Such a CPP-GMR element is called a current-confined-path CPP-GMR element, for example.

JP 2003-8102A discloses a CPP-GMR element including: a magnetization pinned layer whose direction of magnetization is pinned; a magnetization free layer whose direction of magnetization changes in response to an external magnetic field; a nonmagnetic metal intermediate layer provided between the magnetization pinned layer and the magnetization free layer; and a resistance adjustment layer provided between the magnetization pinned layer and the magnetization free layer and made of a material containing conductive carriers not more than $10^{22}/cm^3$. JP 2003-8102A discloses that the material of the resistance adjustment layer is preferably a semiconductor or a semimetal.

Properties of ZnO films such as resistivity are disclosed in "Technology of Transparent Conductive Film", edited by Japan Society for the Promotion of Science, the 166th Committee on Transparent Oxides and Photoelectronic Materials, p. 168.

To use a TMR element for a read head, it is required that the TMR element be reduced in resistance. The reason for this will now be described. Improvements in both recording density and data transfer rate are required of a magnetic disk drive. Accordingly, it is required that the read head exhibit a good high frequency response. However, a TMR element with a high resistance would cause a high stray capacitance in the TMR element and a circuit connected thereto, thereby degrading the high frequency response of the read head. For this reason, it is required that the TMR element be reduced in resistance.

To reduce the resistance of the TMR element, it is typically effective to reduce the thickness of the tunnel barrier layer. However, an excessive reduction in the thickness of the tunnel barrier layer would cause a number of pinholes to develop in the tunnel barrier layer, resulting in a shorter service life of the TMR element. In addition to this, a magnetic coupling may also be established between the free layer and the pinned layer, resulting in deterioration of characteristics of the TMR element such as an increase in noise or a reduction in MR ratio. Here, noise that occurs in read heads is referred to as head noise. Head noise that occurs in a read head employing a TMR element includes shot noise which is a noise component that will not be generated in a read head employing a GMR element. For this reason, a read head employing a TMR element has a problem that it develops greater head noise.

JP 2002-84014A discloses that, by employing a ZnOx thin film (x=0.95 to 1.05) to form the nonmagnetic insulating film as the second layer, it is possible to enhance tolerance to variations of the insulating film and to thereby provide improved reliability of the TMR element. However, JP 2002-84014A gives no consideration to a reduction in resistance of the TMR element.

On the other hand, a CPP-GMR element has a problem that it cannot provide a sufficiently high MR ratio. This is presumably because spin-polarized electrons are scattered at the interface between the nonmagnetic conductive layer and a magnetic layer or in the nonmagnetic conductive layer.

Additionally, a CPP-GMR element is small in magnetoresistance change amount because of its low resistance. Accordingly, in order to obtain higher read output power using a CPP-GMR element, it is necessary to apply a higher voltage to the element. However, the application of a higher voltage to the element would raise the following problems. In a CPP-GMR element, a current is fed in the direction perpendicular to the plane of each layer. This would cause spin-polarized electrons to be injected from the free layer into the pinned layer or from the pinned layer into the free layer. These spin-polarized electrons would produce torque in the free layer or the pinned layer to rotate the magnetization thereof. This torque is herein referred to as spin torque. The spin torque is proportional to the current density. As the voltage applied to the CPP-GMR element is increased, the current density will also increase, thereby causing an increase in the spin torque. An increase in the spin torque would lead to a change in the direction of magnetization of the pinned layer.

The magnetic recording element disclosed in JP 2006-86476A is designed to make use of the aforementioned spin torque to change the direction of magnetization of the free layer. However, as described above, for a CPP-GMR element used for a read head, an increase in spin torque is undesirable because it would change the direction of magnetization of the pinned layer to thereby cause deterioration of the characteristics of the read head.

A current-confined-path CPP-GMR element such as the element disclosed in JP 2006-54257A allows the resistance and magnetoresistance change amount thereof to be greater as compared with a typical CPP-GMR element. However, the current-confined-path CPP-GMR element has the following problems. That is, the insulating layer in the spacer layer of the current-confined-path CPP-GMR element is formed through oxidation treatment, for example. In this case, since the oxidation state of the insulating layer greatly varies, it is difficult to form the spacer layer with stability. Thus, the current-confined-path CPP-GMR element will suffer greater variations in characteristics thereof. Furthermore, like a typical CPP-GMR element, the current-confined-path CPP-GMR element cannot provide a sufficiently high MR ratio because the spin-polarized electrons are scattered in the spacer layer.

The CPP-GMR element disclosed in JP 2003-8102A allows the resistance and magnetoresistance change amount thereof to be greater as compared with a typical CPP-GMR element. JP 2003-8102A discloses that, in order to prevent relaxation of spins in the resistance adjustment layer, it is preferred that the resistance adjustment layer be smaller in thickness and that the thickness be 1 nm or smaller. However, JP 2003-8102A does not disclose a preferable range of the resistance of the CPP-GMR element or that of the thickness of the resistance adjustment layer to be employed in order to provide a high MR ratio while suppressing noise and the effects of spin torque.

OBJECT AND SUMMARY OF THE INVENTION

It is an object of the present invention to provide a magnetoresistive element capable of achieving a high MR ratio while suppressing noise and the effects of spin torque, and to provide a thin-film magnetic head, a head gimbal assembly, a head arm assembly and a magnetic disk drive each of which includes the magnetoresistive element.

A magnetoresistive element of the invention includes: a free layer having a direction of magnetization that changes in response to an external magnetic field; a pinned layer having a fixed direction of magnetization; and a spacer layer disposed between the free layer and the pinned layer. In the magnetoresistive element, a current for detecting magnetic signals is fed in a direction intersecting the plane of each of the foregoing layers. The spacer layer includes: first and second nonmagnetic metal layers each of which is made of a nonmagnetic metal material; and a semiconductor layer that is made of a material containing an oxide semiconductor and that is disposed between the first nonmagnetic metal layer and the second nonmagnetic metal layer. The magnetoresistive element of the invention has a resistance-area product within a range of 0.1 to $0.3\Omega \cdot \mu m^2$, and the spacer layer has a conductivity within a range of 133 to 432 S/cm.

The resistance-area product of the magnetoresistive element of the invention is preferably within a range of 0.12 to $0.3\Omega \cdot \mu m^2$, and more preferably within a range of 0.2 to $0.3\Omega \cdot \mu m^2$.

In the magnetoresistive element of the invention, the oxide semiconductor may be zinc oxide. In this case, the semiconductor layer has a thickness that is preferably within a range of 1 to 2 nm, more preferably within a range of 1.2 to 2 nm, and still more preferably within a range of 1.6 to 2 nm.

In the magnetoresistive element of the invention, each of the first and second nonmagnetic metal layers may be made of one of Cu, Au, and Ag.

In the magnetoresistive element of the invention, each of the first and second nonmagnetic metal layers preferably has a thickness within a range of 0.3 to 2 nm.

A thin-film magnetic head of the invention includes: a medium facing surface that faces toward a recording medium; the magnetoresistive element of the invention disposed near the medium facing surface to detect a signal magnetic field sent from the recording medium; and a pair of electrodes for feeding a current for detecting magnetic signals to the magnetoresistive element.

A head gimbal assembly of the invention includes: a slider including the thin-film magnetic head of the invention and disposed to face toward a recording medium; and a suspension flexibly supporting the slider.

A head arm assembly of the invention includes: a slider including the thin-film magnetic head of the invention and disposed to face toward a recording medium; a suspension flexibly supporting the slider; and an arm for making the slider travel across tracks of the recording medium, the suspension being attached to the arm.

A magnetic disk drive of the invention includes: a slider including the thin-film magnetic head of the invention and disposed to face toward a recording medium that is driven to rotate; and an alignment device supporting the slider and aligning the slider with respect to the recording medium.

According to the magnetoresistive element of the invention, the spacer layer includes the first and second nonmagnetic metal layers and the semiconductor layer disposed therebetween, the resistance-area product of the magnetoresistive element is within a range of 0.1 to 0.3Ω·μm$^2$, and the conductivity of the spacer layer is within a range of 133 to 432 S/cm. As a result, according to the magnetoresistive element of the invention or the thin-film magnetic head, the head gimbal assembly, the head arm assembly or the magnetic disk drive including this magnetoresistive element, it is possible to obtain a high MR ratio while suppressing noise and the effects of spin torque.

Other and further objects, features and advantages of the invention will appear more fully from the following description.

DETAILED DESCRIPTION OF THE PREFERRED EMBODIMENT

Figure 2:
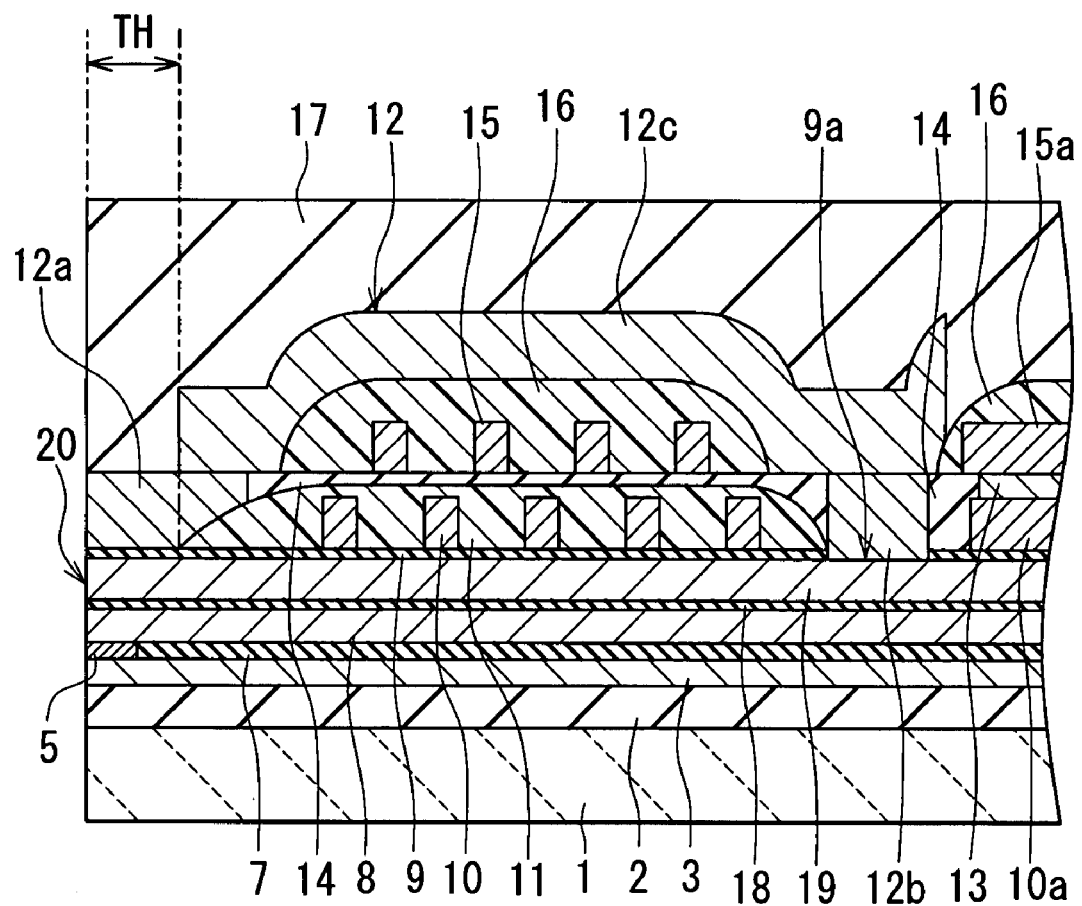
FIG. 2 is a cross-sectional view of a thin-film magnetic head of the embodiment of the invention, wherein the cross section is orthogonal to the medium facing surface and the substrate.
Figure 3:
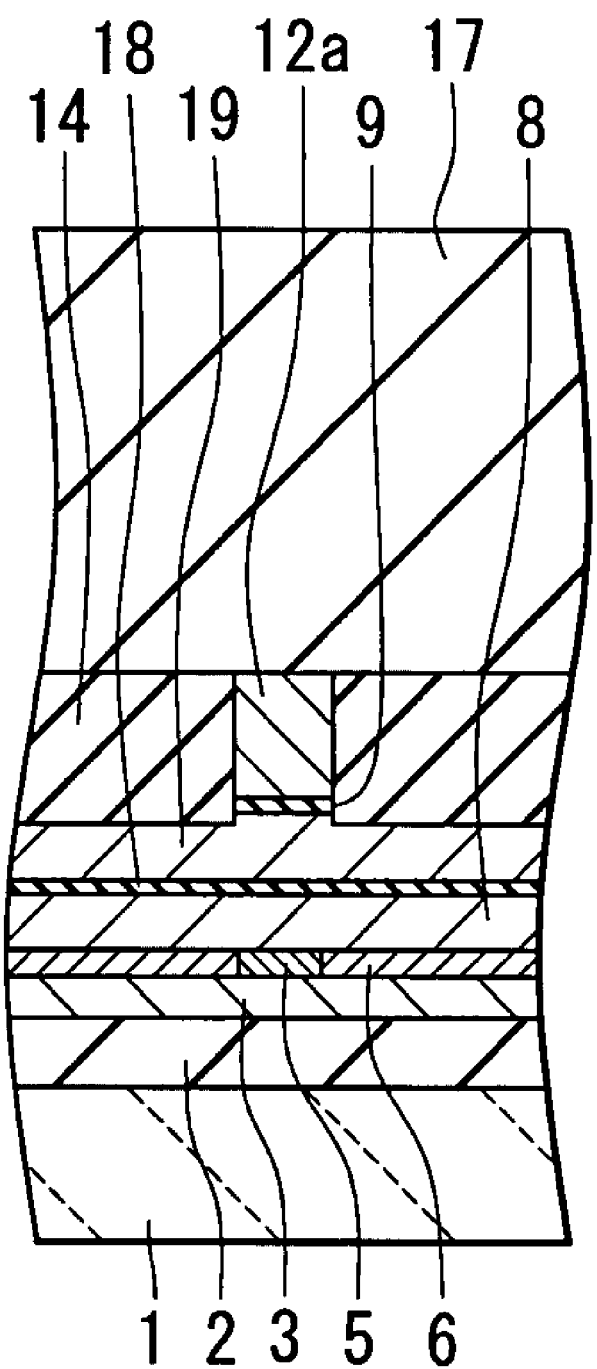
FIG. 3 is a cross-sectional view of the pole portion of the thin-film magnetic head of the embodiment of the invention, wherein the cross section is parallel to the medium facing surface.

An embodiment of the invention will now be described in detail with reference to the accompanying drawings. Reference is now made to FIG. 2 and FIG. 3 to describe the outlines of the configuration and a manufacturing method of a thin-film magnetic head of the embodiment of the invention.

FIG. 2 is a cross-sectional view showing a cross section of the thin-film magnetic head orthogonal to a medium facing surface and a substrate. FIG. 3 is a cross-sectional view showing a cross section of a pole portion of the thin-film magnetic head parallel to the medium facing surface.

The thin-film magnetic head of the embodiment has the medium facing surface 20 that faces toward a recording medium. Furthermore, the thin-film magnetic head of the embodiment includes: a substrate 1 made of a ceramic material such as aluminum oxide and titanium carbide ($Al_2O_3$—TiC); an insulating layer 2 made of an insulating material such as alumina ($Al_2O_3$) and disposed on the substrate 1; a first shield layer 3 made of a magnetic material and disposed on the insulating layer 2; an MR element 5 disposed on the first shield layer 3; two bias field applying layers 6 respectively disposed to be adjacent to two sides of the MR element 5; and an insulating layer 7 disposed around the MR element 5 and the bias field applying layers 6. The MR element 5 is disposed near the medium facing surface 20. The insulating layer 7 is made of an insulating material such as alumina.

The thin-film magnetic head further includes: a second shield layer 8 made of a magnetic material and disposed on the MR element 5, the bias field applying layers 6 and the insulating layer 7; a separating layer 18 made of a nonmagnetic material such as alumina and disposed on the second shield layer 8; and a bottom pole layer 19 made of a magnetic material and disposed on the separating layer 18. The magnetic material used for the second shield layer 8 and the bottom pole layer 19 is a soft magnetic material such as NiFe, CoFe, CoFeNi or FeN. Alternatively, a second shield layer that also functions as a bottom pole layer may be provided in place of the second shield layer 8, the separating layer 18 and the bottom pole layer 19.

The thin-film magnetic head further includes a write gap layer 9 made of a nonmagnetic material such as alumina and disposed on the bottom pole layer 19. The write gap layer 9 has a contact hole 9a formed at a position away from the medium facing surface 20.

The thin-film magnetic head further includes a first layer portion 10 of a thin-film coil disposed on the write gap layer 9. The first layer portion 10 is made of a conductive material such as copper (Cu). In FIG. 2, numeral 10a indicates a connecting portion of the first layer portion 10 connected to a second layer portion 15 of the thin-film coil to be described later. The first layer portion 10 is wound around the contact hole 9a.

The thin-film magnetic head further includes: an insulating layer 11 made of an insulating material and disposed to cover the first layer portion 10 of the thin-film coil and the write gap layer 9 around the first layer portion 10; a top pole layer 12 made of a magnetic material; and a connecting layer 13 made of a conductive material and disposed on the connecting portion 10a. The connecting layer 13 may be made of a magnetic material. Each of the outer and inner edge portions of the insulating layer 11 has a shape of a rounded sloped surface.

The top pole layer 12 includes a track width defining layer 12a, a coupling portion layer 12b and a yoke portion layer 12c. The track width defining layer 12a is disposed on the write gap layer 9 and the insulating layer 11 over a region extending from a sloped portion of the insulating layer 11 closer to the medium facing surface 20 to the medium facing surface 20. The track width defining layer 12a includes: a front-end portion that is formed on the write gap layer 9 and functions as the pole portion of the top pole layer 12; and a connecting portion that is formed on the sloped portion of the insulating layer 11 closer to the medium facing surface 20 and is connected to the yoke portion layer 12c. The front-end portion has a width equal to the write track width. The connecting portion has a width greater than the width of the front-end portion.

The coupling portion layer 12b is disposed on the bottom pole layer 19 at a position where the contact hole 9a is formed. The yoke portion layer 12c couples the track width defining layer 12a and the coupling portion layer 12b to each other. One of ends of the yoke portion layer 12c that is closer to the medium facing surface 20 is located apart from the medium facing surface 20. The yoke portion layer 12c is connected to the bottom pole layer 19 through the coupling portion layer 12b.

The thin-film magnetic head further includes an insulating layer 14 made of an inorganic insulating material such as alumina and disposed around the coupling portion layer 12b. The track width defining layer 12a, the coupling portion layer 12b, the connecting layer 13 and the insulating layer 14 have flattened top surfaces.

The thin-film magnetic head further includes the second layer portion 15 of the thin-film coil disposed on the insulating layer 14. The second layer portion 15 is made of a conductive material such as copper (Cu). In FIG. 2, numeral 15a indicates a connecting portion of the second layer portion 15 that is connected to the connecting portion 10a of the first layer portion 10 of the thin-film coil through the connecting layer 13. The second layer portion 15 is wound around the coupling portion layer 12b.

The thin-film magnetic head further includes an insulating layer 16 disposed to cover the second layer portion 15 of the thin-film coil and the insulating layer 14 around the second layer portion 15. Each of the outer and inner edge portions of the insulating layer 16 has a shape of rounded sloped surface. Part of the yoke portion layer 12c is disposed on the insulating layer 16.

The thin-film magnetic head further includes an overcoat layer 17 disposed to cover the top pole layer 12. The overcoat layer 17 is made of alumina, for example.

The outline of the manufacturing method of the thin-film magnetic head of the embodiment will now be described. In the manufacturing method of the thin-film magnetic head of the embodiment, first, the insulating layer 2 is formed to have a thickness of 0.2 to 5 μm, for example, on the substrate 1 by sputtering or the like. Next, on the insulating layer 2, the first shield layer 3 is formed into a predetermined pattern by plating or the like. Next, although not shown, an insulating layer made of alumina, for example, is formed over the entire surface. Next, the insulating layer is polished by chemical mechanical polishing (hereinafter referred to as CMP), for example, until the first shield layer 3 is exposed, and the top surfaces of the first shield layer 3 and the insulating layer are thereby flattened.

Next, the MR element 5, the two bias field applying layers 6 and the insulating layer 7 are formed on the first shield layer 3. Next, the second shield layer 8 is formed on the MR element 5, the bias field applying layers 6 and the insulating layer 7. The second shield layer 8 is formed by plating or sputtering, for example. Next, the separating layer 18 is formed on the second shield layer 8 by sputtering or the like. Next, the bottom pole layer 19 is formed on the separating layer 18 by plating or sputtering, for example.

Next, the write gap layer 9 is formed to have a thickness of 50 to 300 nm, for example, on the bottom pole layer 19 by sputtering or the like. Next, in order to make a magnetic path, the contact hole 9a is formed by partially etching the write gap layer 9 at a center portion of the thin-film coil that will be formed later.

Next, the first layer portion 10 of the thin-film coil is formed to have a thickness of 2 to 3 μm, for example, on the write gap layer 9. The first layer portion 10 is wound around the contact hole 9a.

Next, the insulating layer 11 is formed into a predetermined pattern to cover the first layer portion 10 of the thin-film coil and the write gap layer 9 disposed around the first layer portion 10. The insulating layer 11 is made of an organic insulating material that exhibits fluidity when heated, such as photoresist. Next, heat treatment is given at a predetermined temperature to flatten the surface of the insulating layer 11. Through this heat treatment, each of the outer and inner edge portions of the insulating layer 11 is made to have a shape of rounded sloped surface.

Next, the track width defining layer 12a of the top pole layer 12 is formed on the write gap layer 9 and the insulating layer 11 over the region extending from the sloped portion of the insulating layer 11 closer to the medium facing surface 20 described later to the medium facing surface 20.

When the track width defining layer 12a is formed, the coupling portion layer 12b is formed on the bottom pole layer 19 at the position where the contact hole 9a is formed, and the connecting layer 13 is formed on the connecting portion 10a at the same time.

Next, pole trimming is performed. That is, in a region around the track width defining layer 12a, the write gap layer 9 and at least a portion of the pole portion of the bottom pole layer 19 close to the write gap layer 9 are etched using the track width defining layer 12a as a mask. As a result, as shown in FIG. 3, a trim structure is formed, wherein the pole portion of the top pole layer 12, the write gap layer 9 and at least a portion of the pole portion of the bottom pole layer 19 have equal widths. The trim structure makes it possible to prevent an increase in effective track width resulting from an expansion of magnetic flux near the write gap layer 9.

Next, the insulating layer 14 is formed to have a thickness of 3 to 4 μm, for example, over the entire top surface of the layered structure that has been formed through the foregoing steps. Next, the insulating layer 14 is polished by CMP, for example, to reach the surfaces of the track width defining layer 12a, the coupling portion layer 12b and the connecting layer 13, and is thereby flattened.

Next, the second layer portion 15 of the thin-film coil is formed to have a thickness of 2 to 3 μm, for example, on the insulating layer 14 that has been flattened. The second layer portion 15 is wound around the coupling portion layer 12b.

Next, the insulating layer 16 is formed into a predetermined pattern to cover the second layer portion 15 of the thin-film coil and the insulating layer 14 disposed around the second layer portion 15. The insulating layer 16 is made of an organic insulating material that exhibits fluidity when heated, such as photoresist. Next, heat treatment is given at a predetermined temperature to flatten the surface of the insulating layer 16. Through this heat treatment, each of the outer and inner edge portions of the insulating layer 16 is made to have a shape of rounded sloped surface. Next, the yoke portion layer 12c is formed on the track width defining layer 12a, the insulating layers 14 and 16, and the coupling portion layer 12b.

Next, the overcoat layer 17 is formed to cover the entire top surface of the layered structure that has been formed through the foregoing steps. Wiring, terminals and so on are then formed on the overcoat layer 17. Finally, machining of the slider including the foregoing layers is performed to form the medium facing surface 20. The thin-film magnetic head including a write head and a read head is thus completed.

The thin-film magnetic head manufactured in this manner has the medium facing surface 20 that faces toward a recording medium, the read head, and the write head. The read head is disposed near the medium facing surface 20 to detect a signal magnetic field sent from the recording medium. The configuration of the read head will be described in detail later.

The write head includes: the bottom pole layer 19 and the top pole layer 12 that are magnetically coupled to each other and include the respective pole portions that are opposed to each other and placed in regions of the pole layers on a side of the medium facing surface 20; the write gap layer 9 provided between the pole portion of the bottom pole layer 19 and the pole portion of the top pole layer 12; and the thin-film coil 10, 15 at least part of which is placed between the bottom pole layer 19 and the top pole layer 12 and insulated from the bottom pole layer 19 and the top pole layer 12. In this thin-film magnetic head, as shown in FIG. 2, the length from the medium facing surface 20 to the end of the insulating layer 11 closer to the medium facing surface 20 corresponds to throat height TH. Note that the throat height refers to a length (height) from the medium facing surface 20 to a point at which the distance between the two pole layers starts to increase. It should be noted that, while FIG. 2 and FIG. 3 show a write head for use with the longitudinal magnetic recording system, the write head of the embodiment can be one for use with the perpendicular magnetic recording system.

Figure 1:
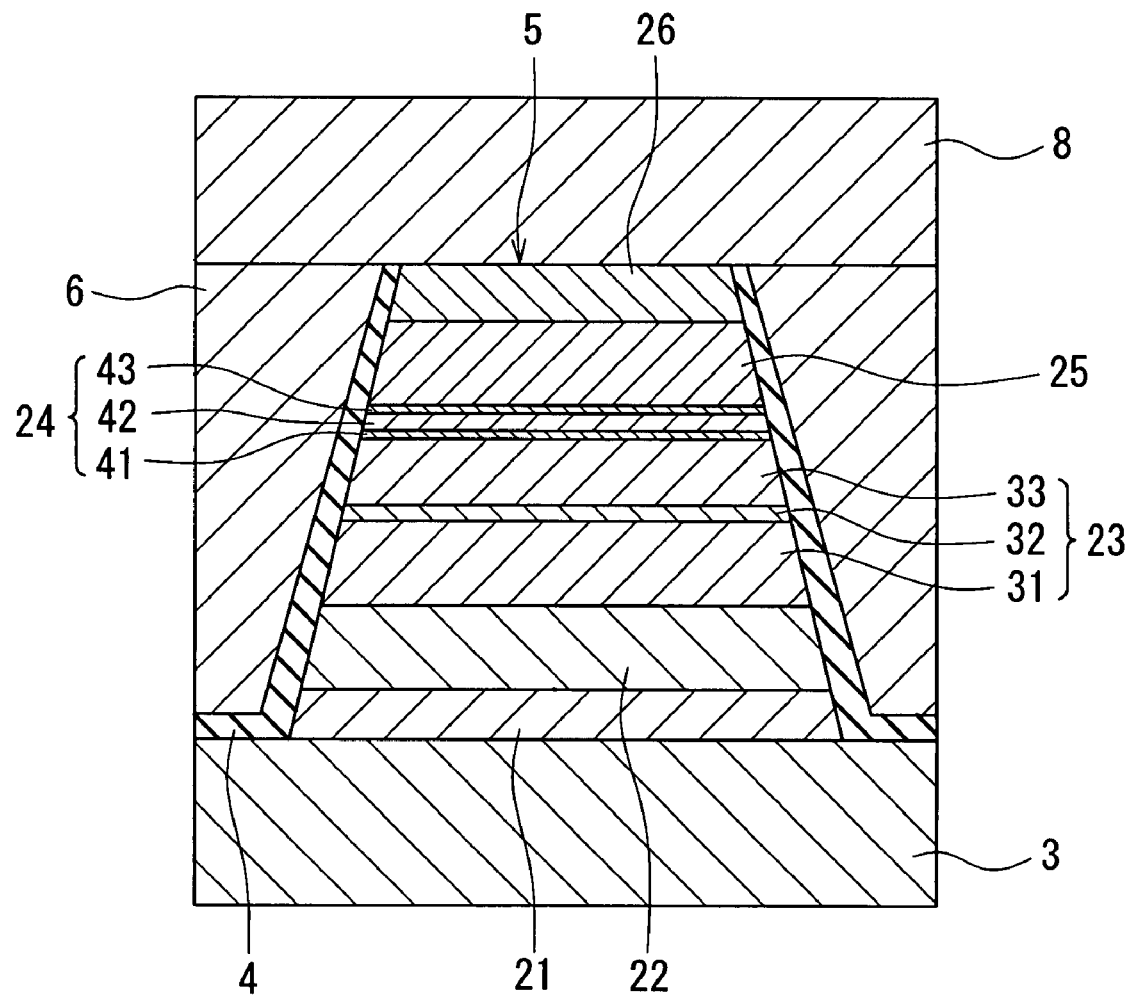
FIG. 1 is a cross-sectional view of a read head of an embodiment of the invention, wherein the cross section is parallel to the medium facing surface.

Reference is now made to FIG. 1 to describe the configuration of the read head of the embodiment in detail. FIG. 1 is a cross-sectional view showing a cross section of the read head parallel to the medium facing surface. As shown in FIG. 1, the read head includes the first shield layer 3 and the second shield layer 8 disposed at a specific distance from each other, and the MR element 5 disposed between the first shield layer 3 and the second shield layer 8. The MR element 5 and the second shield layer 8 are stacked on the first shield layer 3.

The read head further includes: the two bias field applying layers 6 that are respectively disposed to be adjacent to the two sides of the MR element 5 and that apply a bias magnetic field to the MR element 5; and the insulating layer 4 disposed between the first shield layer 3 and the bias field applying layers 6 and between the MR element 5 and the bias field applying layers 6.

The bias field applying layers 6 are formed using a hard magnetic layer (hard magnet) or a layered structure made up of ferromagnetic layers and antiferromagnetic layers, for example. To be specific, the bias field applying layers 6 are made of CoPt or CoCrPt, for example. The insulating layer 4 is made of alumina, for example.

The MR element 5 of the embodiment is a CPP-GMR element. In this MR element 5, a sense current, which is a current for detecting magnetic signals, is fed in a direction intersecting the plane of each layer making up the MR element 5, such as the direction perpendicular to the plane of each layer making up the MR element 5. The first shield layer 3 and the second shield layer 8 also function as a pair of electrodes for feeding the sense current to the MR element 5 in a direction intersecting the plane of each layer making up the MR element 5, such as the direction perpendicular to the plane of each layer making up the MR element 5. Alternatively, besides the first shield layer 3 and the second shield layer 8, a pair of electrodes may be provided on the top and bottom of the MR element 5, respectively. The MR element 5 has a resistance that changes in response to an external magnetic field, that is, a signal magnetic field from the recording medium. The resistance of the MR element 5 can be determined from the sense current. It is thus possible to read data stored on the recording medium through the use of the read head.

FIG. 1 shows an example of configuration of the MR element 5. This MR element 5 includes: a free layer 25 that is a ferromagnetic layer whose direction of magnetization changes in response to the signal magnetic field; a pinned layer 23 that is a ferromagnetic layer whose direction of magnetization is fixed; and a spacer layer 24 disposed between the free layer 25 and the pinned layer 23. In the example shown in FIG. 1, the pinned layer 23 is disposed closer to the first shield layer 3 than is the free layer 25. However, it is acceptable that the free layer 25 be disposed closer to the first shield layer 3 instead. The MR element 5 further includes: an antiferromagnetic layer 22 disposed on a side of the pinned layer 23 farther from the spacer layer 24; an underlying layer 21 disposed between the first shield layer 3 and the antiferromagnetic layer 22; and a protection layer 26 disposed between the free layer 25 and the second shield layer 8. In the MR element 5 shown in FIG. 1, the underlying layer 21, the antiferromagnetic layer 22, the pinned layer 23, the spacer layer 24, the free layer 25 and the protection layer 26 are stacked in this order on the first shield layer 3.

The antiferromagnetic layer 22 is a layer for fixing the direction of magnetization of the pinned layer 23 by means of exchange coupling with the pinned layer 23. The underlying layer 21 is provided for improving the crystallinity and orientability of each layer formed thereon and particularly for enhancing the exchange coupling between the antiferromagnetic layer 22 and the pinned layer 23. The protection layer 26 is a layer for protecting the layers located therebelow.

The underlying layer 21 has a thickness of 2 to 6 nm, for example. For example, a layered structure made up of a Ta layer and a Ru layer is used as the underlying layer 21.

The antiferromagnetic layer 22 has a thickness of 5 to 30 nm, for example. The antiferromagnetic layer 22 is made of an antiferromagnetic material containing Mn and at least one element $M_{II}$ selected from the group consisting of Pt, Ru, Rh, Pd, Ni, Cu, Ir, Cr and Fe, for example. The Mn content of the material is preferably equal to or higher than 35 atomic percent and lower than or equal to 95 atomic percent, while the content of the other element $M_{II}$ of the material is preferably equal to or higher than 5 atomic percent and lower than or equal to 65 atomic percent. There are two types of the anti-ferromagnetic material, one is a non-heat-induced antiferromagnetic material that exhibits antiferromagnetism without any heat treatment and induces an exchange coupling magnetic field between a ferromagnetic material and itself, and the other is a heat-induced antiferromagnetic material that exhibits antiferromagnetism by undergoing heat treatment. The antiferromagnetic layer 22 can be made of either of these types. The non-heat-induced antiferromagnetic materials include a Mn alloy that has a γ phase, such as RuRhMn, FeMn, and IrMn. The heat-induced antiferromagnetic materials include a Mn alloy that has a regular crystal structure, such as PtMn, NiMn, and PtRhMn.

As a layer for fixing the direction of magnetization of the pinned layer 23, a hard magnetic layer made of a hard magnetic material such as CoPt may be provided in place of the antiferromagnetic layer 22 described above. In this case, the material of the underlying layer 21 is Cr, CrTi or TiW, for example.

In the pinned layer 23, the direction of magnetization is fixed by exchange coupling with the antiferromagnetic layer 22 at the interface between the antiferromagnetic layer 22 and the pinned layer 23. The pinned layer 23 of the embodiment is a so-called synthetic pinned layer, having an outer layer 31, a nonmagnetic middle layer 32 and an inner layer 33 that are stacked in this order on the antiferromagnetic layer 22. Each of the outer layer 31 and the inner layer 33 includes a ferromagnetic layer made of a ferromagnetic material containing at least Co selected from the group consisting of Co and Fe, for example. The outer layer 31 and the inner layer 33 are antiferromagnetic-coupled to each other and the directions of magnetization thereof are fixed to opposite directions. The outer layer 31 has a thickness of 3 to 7 nm, for example. The inner layer 33 has a thickness of 3 to 10 nm, for example.

The nonmagnetic middle layer 32 has a thickness of 0.35 to 1.0 nm, for example. The nonmagnetic middle layer 32 is made of a nonmagnetic material containing at least one element selected from the group consisting of Ru, Rh, Ir, Re, Cr, Zr and Cu, for example. The nonmagnetic middle layer 32 is provided for producing antiferromagnetic exchange coupling between the inner layer 33 and the outer layer 31, and for fixing the magnetizations of the inner layer 33 and the outer layer 31 to opposite directions. Note that the magnetizations of the inner layer 33 and the outer layer 31 in opposite directions include not only the case in which there is a difference of 180 degrees between these directions of magnetizations, but also the case in which there is a difference of 180±20 degrees between them.

The spacer layer 24 of the embodiment includes: a first nonmagnetic metal layer 41 and a second nonmagnetic metal layer 43 each of which is made of a nonmagnetic metal material; and a semiconductor layer 42 that is made of a material containing an oxide semiconductor and that is disposed between the first nonmagnetic metal layer 41 and the second nonmagnetic metal layer 43. The first nonmagnetic metal layer 41 touches the inner layer 33, while the second nonmagnetic metal layer 43 touches the free layer 25.

The oxide semiconductor used for the semiconductor layer 42 can be one of zinc oxide (ZnO), titanium oxide (TiO), tin oxide (SnO), and indium oxide (InO), for example. Of these, ZnO is preferable, in particular, as the oxide semiconductor used for the semiconductor layer 42. When the oxide semiconductor used for the semiconductor layer 42 is ZnO, the thickness of the semiconductor layer 42 is preferably within a range of 1 to 2 nm, more preferably within a range of 1.2 to 2 nm, and still more preferably within a range of 1.6 to 2 nm. The semiconductor layer 42 may be made of a material containing an additive besides the oxide semiconductor.

The nonmagnetic metal material used for the nonmagnetic metal layers 41 and 43 can be one of Cu, Au, Ag, AuCu, CuZn, Cr, Ru, and Rh, for example. Of these, Cu, Au, and Ag are preferable, of which Cu is particularly preferable, as the nonmagnetic metal material used for the nonmagnetic metal layers 41 and 43. Each of the nonmagnetic metal layers 41 and 43 preferably has a thickness within a range of 0.3 to 2 nm.

The free layer 25 has a thickness of 2 to 10 nm, for example. The free layer 25 is formed of a ferromagnetic layer having a low coercivity. The free layer 25 may include a plurality of ferromagnetic layers stacked.

The protection layer 26 has a thickness of 0.5 to 20 nm, for example. The protection layer 26 may be a Ta layer or a Ru layer, for example. Alternatively, the protection layer 26 may have a two-layer structure made up of a combination of layers such as Ta and Ru layers, or may have a three-layer structure made up of a combination of layers such as a combination of Ta, Ru and Ta layers or a combination of Ru, Ta and Ru layers.

At least one of the inner layer 33 and the free layer 25 may include a Heusler alloy layer.

The resistance-area product (RA) of the MR element 5 of the embodiment is preferably within a range of 0.1 to 0.3$\Omega\cdot\mu m^2$, more preferably within a range of 0.12 to 0.3$\Omega\cdot\mu m^2$, and still more preferably within a range of 0.2 to 0.3$\Omega\cdot\mu m^2$.

Descriptions will now be provided on a manufacturing method of the read head of FIG. 1. In the manufacturing method of this read head, first, the first shield layer 3 having a predetermined pattern is formed on the insulating layer 2 by plating or the like. Next, on the first shield layer 3, films to be the respective layers making up the MR element 5 are formed one by one by sputtering, for example, to form a layered structure consisting of these films. Next, this layered structure is subjected to heat treatment to be heated at a predetermined temperature. The temperature of this heat treatment is preferably within a range of 200° C. to 300° C. Next, the MR element 5 is formed by patterning the layered structure by etching. Next, the insulating layer 4 and the bias field applying layers 6 are formed in this order by sputtering, for example. Next, the second shield layer 8 is formed by plating or sputtering, for example, on the MR element 5 and the bias field applying layers 6.

Note that the aforementioned heat treatment is carried out for the purpose of heating films to be the respective layers making up the spacer layer 24. Accordingly, this heat treatment can be carried out at any stage, but only after the films to be the respective layers making up the spacer layer 24 have been formed. For example, the heat treatment can be performed after the aforementioned layered structure has been patterned.

The operation of the thin-film magnetic head of the embodiment will now be described. The thin-film magnetic head writes data on a recording medium by using the write head and reads data written on the recording medium by using the read head.

In the read head, the direction of the bias magnetic field produced by the bias field applying layers 6 intersects the direction orthogonal to the medium facing surface 20 at a right angle. In the MR element 5, when no signal magnetic field is present, the direction of magnetization of the free layer 25 is aligned with the direction of the bias magnetic field. On the other hand, the direction of magnetization of the pinned layer 23 is fixed to the direction orthogonal to the medium facing surface 20.

In the MR element 5, the direction of magnetization of the free layer 25 changes in response to the signal magnetic field sent from the recording medium. This causes a change in the relative angle between the direction of magnetization of the free layer 25 and the direction of magnetization of the pinned layer 23, and as a result, the resistance of the MR element 5 changes. The resistance of the MR element 5 can be determined from the potential difference between the first and second shield layers 3 and 8 produced when a sense current is fed to the MR element 5 from the shield layers 3 and 8. Thus, it is possible for the read head to read data stored on the recording medium.

In the MR element 5 of the embodiment, the spacer layer 24 includes the two nonmagnetic metal layers 41 and 43, and the semiconductor layer 42 disposed therebetween. As a result, according to the embodiment, it is possible to increase the resistance-area product of the MR element 5, compared with a case where the spacer layer 24 does not include the semiconductor layer 42. The respective preferable ranges of the resistance-area product of the MR element 5, the conductivity of the spacer layer 24 and the thickness of the semiconductor layer 42 mentioned previously are determined based on the results of a first experiment to be described later. In addition, the preferable thickness range for each of the nonmagnetic metal layers 41 and 43 mentioned previously is determined based on the results of a fourth experiment to be described later.

According to the embodiment, as can be seen from the results of the first experiment to be described later, it is possible for the MR element 5 to achieve a high MR ratio while suppressing head noise and the effects of spin torque.

Furthermore, since oxide semiconductors to be used for the semiconductor layer 42 are oxides, they have features of being manufacturable at low cost, being stable in the air, and being more environmentally friendly than other compound semiconductors. Additionally, the semiconductor layer 42 to be formed using an oxide semiconductor can be easily formed by sputtering or the like, like the other layers making up the MR element 5. ZnO is particularly preferable as the oxide semiconductor used for the semiconductor layer 42, as it noticeably exhibits the aforementioned features of oxide semiconductors. ZnO as an oxide semiconductor has a band gap of approximately 3.4 eV. ZnO as an oxide semiconductor is likely to be an n-type semiconductor, but can also be a p-type semiconductor.

The semiconductor layer 42 may also be made of a material containing an additive as well as an oxide semiconductor. The role of the additive is to form a donor or an acceptor in the semiconductor layer 42 and to thereby increase the carrier density of the semiconductor layer 42. Accordingly, the additive can be used to control the resistance-area product of the MR element 5. For example, the additive used may be one or more of GaO, InO, BO, AlO, CoO, FeO, and MnO. When the proportion of the oxide semiconductor contained in the material forming the semiconductor layer 42 is assumed as 100 weight percent, the proportion of the additive contained in the material forming the semiconductor layer 42 is preferably within a range of 1 to 5 weight percent.

Descriptions will now be provided on the first experiment mentioned previously. In this experiment, 12 types of MR element samples numbered 1 to 12 were prepared, and then the resistance-area product ($\Omega \cdot \mu m^2$), the MR ratio (%), the head noise ($\mu Vrms/\sqrt{Hz}$), the current density ($A/cm^2$), and the exchange coupling magnetic field (Oe) of the pinned layer 23 of these samples (MR elements) were determined. Note that 1 Oe is equal to 79.6 A/m. For the current density, the value thereof was obtained by setting the voltage applied to the MR element 5 to 100 mV.

The film configuration of the samples 2 to 11 is the same as that of the MR element 5 of the embodiment shown in FIG. 1. The specific film configuration of the samples 2 to 11 is shown in Table 1 below. As shown in Table 1, for the samples 2 to 11, the semiconductor layer 42 is made of ZnO, and the first nonmagnetic metal layer 41 and the second nonmagnetic metal layer 43 are made of Cu. The thickness T1 of the semiconductor layer 42 is different among the samples 2 and 11. The film configuration of the sample 1 is the same as that of the samples 2 to 11 except that the sample 1 does not have the semiconductor layer 42. The film configuration of the sample 12 is such that an aluminum oxide ($Al_2O_x$) film with a thickness of 1.0 nm is provided in place of the semiconductor layer 42 of the samples 2 to 11. Accordingly, the sample 12 is not a CPP-GMR element but a TMR element.

TABLE 1

| | Layer | Substance | Thickness (nm) |
|---|---|---|---|
| | Protection layer | Ta | 2 |
| | | Ru | 13 |
| | Free layer | CoFe | 4 |
| Spacer | Second nonmagnetic metal layer | Cu | 0.7 |
| layer | Semiconductor layer | ZnO | T1 |
| | First nonmagnetic metal layer | Cu | 0.7 |
| Pinned | Inner layer | CoFe | 5.5 |
| layer | Nonmagnetic middle layer | Ru | 0.8 |
| | Outer layer | CoFe | 5 |
| | Antiferromagnetic layer | IrMn | 5.5 |
| | Underlying layer | Ru | 2 |
| | | Ta | 1 |

To prepare the samples 1 to 11, films to be the respective layers making up the MR element 5 were formed one by one to obtain a layered structure consisting of these films, and this layered structure was subjected to heat treatment. The heat treatment was carried out at a temperature of 250° C. for 5 hours in a vacuum of $1.0 \times 10^{-4}$ Pa or less.

When viewed from above, each sample has a shape of a rectangle that is 0.06 µm in width and 0.10 µm in length. This shape is approximately the same as that of the MR element 5 used for an actual read head. Note that the aforementioned "width" refers to a length taken in the direction of track width, while the "length" refers to a length taken in the direction orthogonal to the medium facing surface 20. The resistance-area product and MR ratio of each sample were measured using the direct-current four-probe method. The head noise of each sample was measured with a spectrum analyzer. The values of head noise measured were those obtained when the signal had a frequency of 20 MHz and a bandwidth of 1 Hz. The current density of each sample was determined by calculation based on the resistance-area product. The exchange coupling magnetic field of the pinned layer 23 of each sample was determined from the magnetoresistive curve. Tendencies made clear from the results of the first experiment discussed below were approximately the same among the samples regardless of their shapes.

Figure 8:
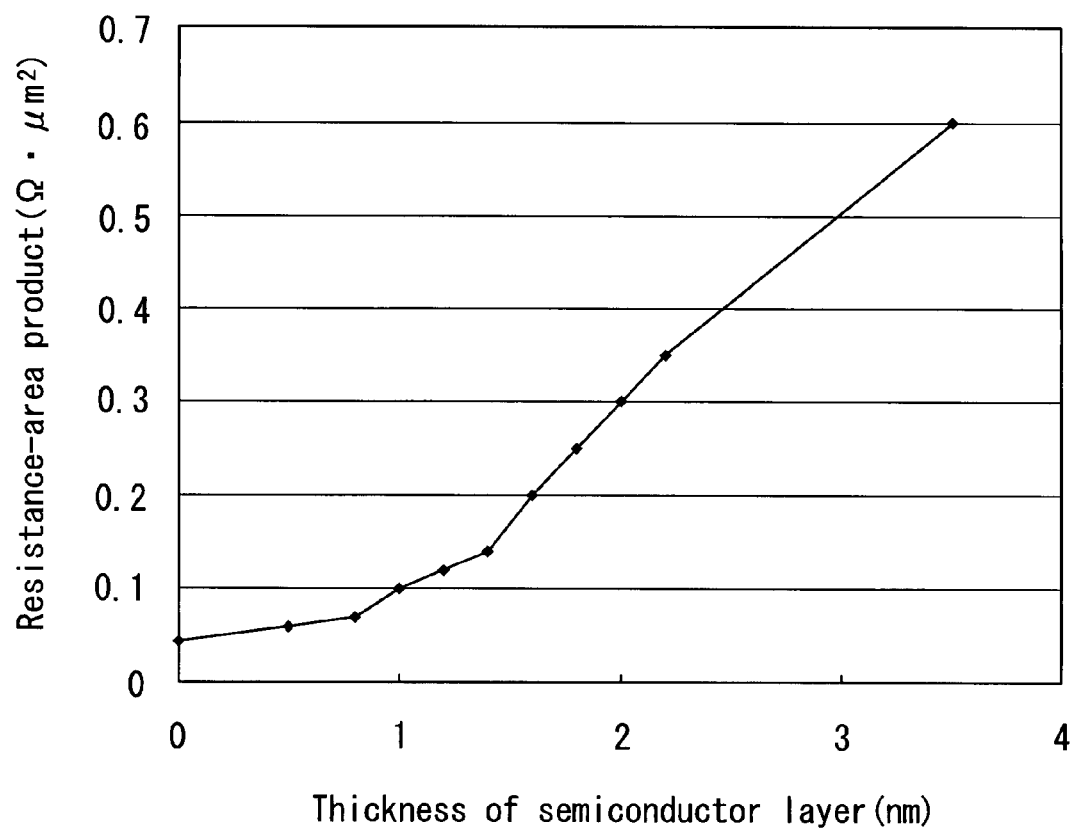
FIG. 8 is a plot showing the relationship between the thickness of the semiconductor layer and the resistance-area product in an MR element used in a first experiment.
Figure 9:
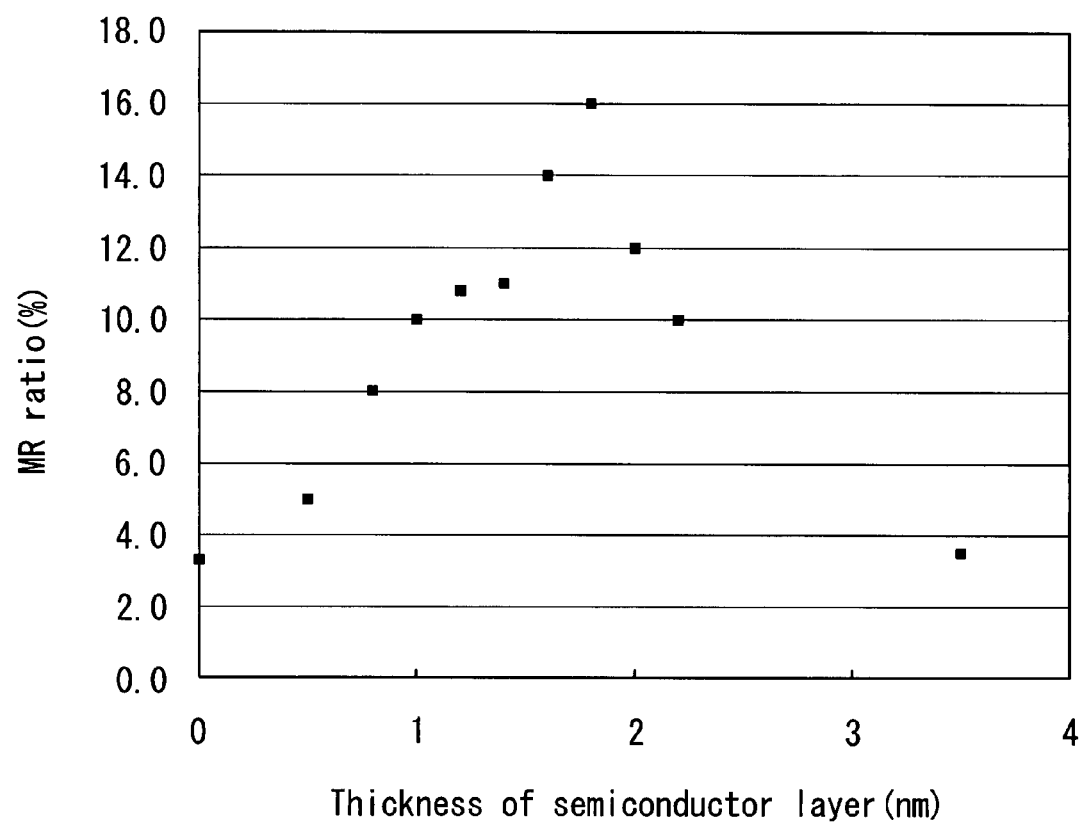
FIG. 9 is a plot showing the relationship between the thickness of the semiconductor layer and the MR ratio in the MR element used in the first experiment.
Figure 10:
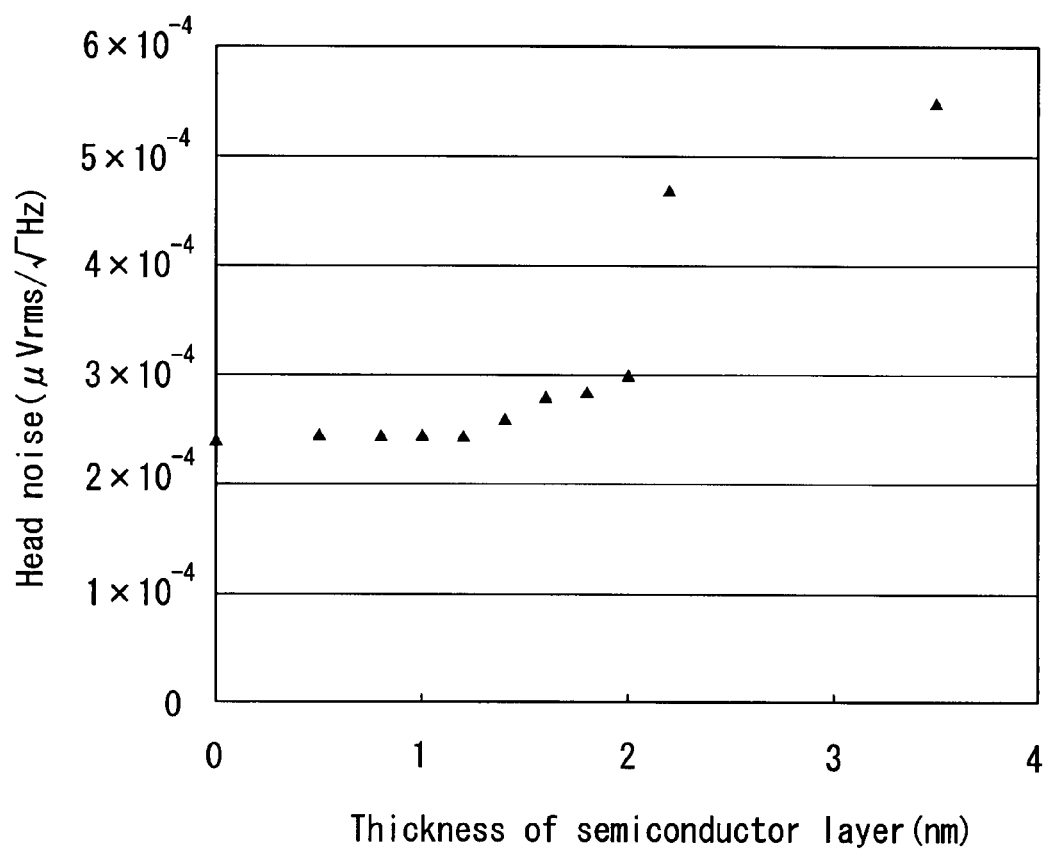
FIG. 10 is a plot showing the relationship between the thickness of the semiconductor layer and the head noise in the MR element used in the first experiment.

The results of the first experiment are shown in Table 2 below. Note that in Table 2, the entry of the "thickness of semiconductor layer" column for the sample 12 represents the thickness of the aluminum oxide ($Al_2O$ film provided in place of the semiconductor layer 42. FIG. 8 shows the relationship between the thickness of the semiconductor layer 42 and the resistance-area product for the samples 1 to 11. FIG. 9 shows the relationship between the thickness of the semiconductor layer 42 and the MR ratio for the samples 1 to 11. FIG. 10 shows the relationship between the thickness of the semiconductor layer 42 and the head noise for the samples 1 to 11.

TABLE 2

| Sample | Thickness of semiconductor layer (nm) | Resistance-area product ($\Omega \cdot \mu m^2$) | MR ratio (%) | Head noise ($\mu Vrms/\sqrt{Hz}$) | Current density ($A/cm^2$) | Exchange coupling magnetic field (Oe) |
|---|---|---|---|---|---|---|
| 1 | 0 | 0.045 | 3.3 | $2.40 \times 10^{-4}$ | $2.22 \times 10^8$ | 860 |
| 2 | 0.5 | 0.06 | 5.0 | $2.45 \times 10^{-4}$ | $1.67 \times 10^8$ | 1300 |

TABLE 2-continued

| Sample | Thickness of semiconductor layer (nm) | Resistance-area product ($\Omega \cdot \mu m^2$) | MR ratio (%) | Head noise ($\mu Vrms/\sqrt{Hz}$) | Current density ($A/cm^2$) | Exchange coupling magnetic field (Oe) |
|---|---|---|---|---|---|---|
| 3 | 0.8 | 0.07 | 8.0 | $2.44 \times 10^{-4}$ | $1.43 \times 10^8$ | 1320 |
| 4 | 1.0 | 0.1 | 10.0 | $2.45 \times 10^{-4}$ | $1.00 \times 10^8$ | 1500 |
| 5 | 1.2 | 0.12 | 10.8 | $2.44 \times 10^{-4}$ | $8.33 \times 10^7$ | 1515 |
| 6 | 1.4 | 0.14 | 11.0 | $2.60 \times 10^{-4}$ | $7.14 \times 10^7$ | 1510 |
| 7 | 1.6 | 0.2 | 14.0 | $2.80 \times 10^{-4}$ | $5.00 \times 10^7$ | 1520 |
| 8 | 1.8 | 0.25 | 16.0 | $2.85 \times 10^{-4}$ | $4.00 \times 10^7$ | 1515 |
| 9 | 2.0 | 0.3 | 12.0 | $3.00 \times 10^{-4}$ | $3.33 \times 10^7$ | 1525 |
| 10 | 2.2 | 0.35 | 10.0 | $4.70 \times 10^{-4}$ | $2.86 \times 10^7$ | 1515 |
| 11 | 3.5 | 0.6 | 3.5 | $5.50 \times 10^{-4}$ | $1.67 \times 10^7$ | 1520 |
| 12 | ($Al_2O_x$) 1.0 | 1.7 | 26 | $5.80 \times 10^{-4}$ | $5.88 \times 10^6$ | 1525 |

In the samples 1 to 11, as the thickness of the semiconductor layer 42 increases, the resistance-area product increases and the current density decreases. The sample 12 is extremely greater in resistance-area product than the samples 1 to 11.

In the samples 1 to 11, the exchange coupling magnetic field of the pinned layer 23 is 1500 Oe or greater when the thickness of the semiconductor layer 42 is 1 nm or more, whereas the exchange coupling magnetic field of the pinned layer 23 is less than 1500 Oe when the thickness of the semiconductor layer 42 is less than 1 nm. This is presumably because, when the thickness of the semiconductor layer 42 is less than 1 nm, the resistance-area product of the MR element 5 is excessively reduced, and as a result, the current density is excessively increased, so that the effects of spin torque are noticeably exerted on the magnetization of the pinned layer 23. To prevent the exchange coupling magnetic field of the pinned layer 23 from being reduced, it is preferred that the thickness of the semiconductor layer 42 be 1 nm or greater and that the resistance-area product be $0.1 \Omega \cdot \mu m^2$ or greater.

On the other hand, an excessive increase in the thickness of the semiconductor layer 42 causes an excessive increase in resistance-area product, resulting in an excessive increase in the resistance of the entire MR element. Furthermore, when the thickness of the semiconductor layer 42 is greater than 2 nm, the MR ratio decreases. This is presumably because scattering of spin-polarized electrons in the semiconductor layer 42 noticeably occurs when the thickness of the semiconductor layer is greater than 2 nm. Furthermore, when the thickness of the semiconductor layer 42 is greater than 2 nm, head noise abruptly increases. In view of these, it is preferable that the thickness of the semiconductor layer 42 be 2 nm or smaller and that the resistance-area product be $0.3 \Omega \cdot \mu m^2$ or smaller.

From the foregoing, it is preferable that the thickness of the semiconductor layer 42 be within a range of 1 to 2 nm, and that the resistance-area product of the MR element be within a range of 0.1 to $0.3 \Omega \cdot \mu m^2$.

The head noise caused by the MR element 5 is considered as shot noise that results from the occurrence of tunnel conduction of the spin-polarized electrons in the spacer layer 24. Here, the head noise Vs when the signal has a bandwidth of $\Delta f$ (Hz) is expressed by the following equation, where e represents the charge of an electron ($1.6 \times 10^{-19}$ coulomb), I represents the current (A) flowing through the MR element 5, $\Delta f$ represents the bandwidth (Hz) of the signal, and R represents the resistance ($\Omega$) of the MR element 5.

$$Vs = R \times \sqrt{(2eI\Delta f)}$$

As mentioned previously, the values of head noise determined in the first experiment were those obtained when the signal had a frequency of 20 MHz and a bandwidth $\Delta f$ of 1 Hz. An increase in thickness of the semiconductor layer 42 would cause tunnel conduction of the spin-polarized electrons in the semiconductor layer 42, thereby causing head noise to occur at a noticeable level. At this time, the theoretically predicted value of the head noise is $4.7 \times 10^{-4}$ $\mu Vrms/\sqrt{Hz}$. Accordingly, if the value of head noise of a sample exceeds $4.7 \times 10^{-4}$ $\mu Vrms/\sqrt{Hz}$, it is considered that tunnel conduction of the spin-polarized electrons occurs in the spacer layer 24 of the sample. Since the MR element 5 of the embodiment is not a TMR element but a CPP-GMR element, it is necessary to produce ohmic conduction in the spacer layer 24 rather than tunnel conduction. As can be seen from FIG. 10, the results of the first experiment show that the head noise is low when the thickness of the semiconductor layer 42 is 2 nm or smaller, whereas the head noise abruptly increases when the thickness of the semiconductor layer 42 is 2.2 nm or greater. From this, it is considered that at least when the thickness of the semiconductor layer 42 is 2 nm or smaller, ohmic conduction rather than tunnel conduction occurs in the spacer layer 24.

When the thickness of the semiconductor layer 42 is within the range of 1 to 2 nm and the resistance-area product of the MR element 5 is within the range of 0.1 to $0.3 \Omega \cdot \mu m^2$, the MR ratio is 10% or higher. Accordingly, also from the viewpoint of increasing the MR ratio, it is preferable that the thickness of the semiconductor layer 42 be within the range of 1 to 2 nm, and that the resistance-area product of the MR element 5 be within the range of 0.1 to $0.3 \Omega \cdot \mu m^2$.

Here, Table 3 below lists the thickness (nm) of the semiconductor layer 42, the resistance-area product ($\Omega \cdot \mu m^2$), the MR ratio (%), the resistivity ($\Omega \cdot cm$) of the spacer layer 24, and the conductivity (S/cm) of the spacer layer 24 for the samples 1 to 11. The resistivity and the conductivity of the spacer layer 24 were determined as follows. To begin with, the resistance-area products other than the resistance-area product of the spacer layer 24 were subtracted from the resistance-area product of the MR element 5 to determine the resistance-area product of the spacer layer 24. The resistance-area products other than the resistance-area product of the spacer layer 24 include the resistance-area product of the interface between the spacer layer 24 and the pinned layer 23, the resistance-area product of the interface between the spacer layer 24 and the free layer 25, and the resistance-area products of the layers of the MR element 5 other than the spacer layer 24. The resistance-area product of the interface between the spacer layer 24 and the pinned layer 23, and the resistance-area product of the interface between the spacer layer 24 and the free layer 25 were estimated to be 0.2 mΩ·μm², based on the descriptions in T. Valet and A. Fert, Phys. Rev. B48, 7099 (1993) and J. Bass and W. P. Pratt Jr., J. Magn. Mater. 200, 274 (1999). The resistance-area product of the spacer layer 24 was then divided by the thickness of the spacer layer 24 to determine the resistivity of the spacer layer 24. The conductivity of the spacer layer 24 is the reciprocal of the resistivity of the spacer layer 24.

TABLE 3

| Sample | Thickness of semi-conductor layer (nm) | Resistance-area product (Ω · μm²) | MR ratio (%) | Resistivity of spacer layer (Ω · cm) | Conductivity of spacer layer (S/cm) |
|---|---|---|---|---|---|
| 1 | 0 | 0.045 | 3.3 | $3.56 \times 10^{-5}$ | 28112.45 |
| 2 | 0.5 | 0.06 | 5.0 | $8.16 \times 10^{-4}$ | 1225.97 |
| 3 | 0.8 | 0.07 | 8.0 | $1.16 \times 10^{-3}$ | 862.81 |
| 4 | 1.0 | 0.1 | 10.0 | $2.31 \times 10^{-3}$ | 432.45 |
| 5 | 1.2 | 0.12 | 10.8 | $2.90 \times 10^{-3}$ | 344.38 |
| 6 | 1.4 | 0.14 | 11.0 | $3.41 \times 10^{-3}$ | 293.20 |
| 7 | 1.6 | 0.2 | 14.0 | $5.18 \times 10^{-3}$ | 192.93 |
| 8 | 1.8 | 0.25 | 16.0 | $6.42 \times 10^{-3}$ | 155.72 |
| 9 | 2.0 | 0.3 | 12.0 | $7.52 \times 10^{-3}$ | 133.07 |
| 10 | 2.2 | 0.35 | 10.0 | $8.49 \times 10^{-3}$ | 117.84 |
| 11 | 3.5 | 0.6 | 3.5 | $1.13 \times 10^{-2}$ | 88.21 |

As can be seen from Table 3, when the thickness of the semiconductor layer 42 is within the range of 1 to 2 nm and the resistance-area product of the MR element 5 is within the range of 0.1 to 0.3Ω·μm², the conductivity of the spacer layer 24 is within a range of 133 to 432 S/cm. Accordingly, it is preferred that the spacer layer 24 have a conductivity within the range of 133 to 432 S/cm.

According to the embodiment, in the process of manufacturing the MR element 5, heat treatment is performed to heat the films to be the respective layers making up the spacer layer 24. By performing this heat treatment, it is possible to provide the MR element 5 in which the thickness of the semiconductor layer 42 is within the range of 1 to 2 nm and the resistance-area product of the MR element 5 is within the range of 0.1 to 0.3Ω·μm², as mentioned above. The necessity of this heat treatment will be described in more detail later with reference to the results of a second experiment.

As explained in the foregoing, the results of the first experiment indicate that, to obtain a high MR ratio in the MR element 5 while suppressing head noise and the effects of spin torque, simply providing the semiconductor layer 42 in the spacer layer 24 is not sufficient but it is further necessary to properly control the resistance-area product of the MR element 5, and in order to achieve this, it is necessary to properly control the thickness of the semiconductor layer 42.

As described above, from the results of the first experiment, it is preferable that the resistance-area product of the MR element 5 be within the range of 0.1 to 0.3Ω·μm², and the conductivity of the spacer layer 24 be within the range of 133 to 432 S/cm. In addition, when the oxide semiconductor used for the semiconductor layer 42 is ZnO, it is preferred that the thickness of the semiconductor layer 42 be within the range of 1 to 2 nm in order to allow the resistance-area product of the MR element 5 to fall within the range of 0.1 to 0.3Ω·μm². A higher MR ratio is obtained when the thickness of the semi-conductor layer 42 is within the range of 1 to 2 nm. This is presumably because scattering of the spin-polarized electrons in the spacer layer 24 is suppressed when the thickness of the semiconductor layer 42 is within the range of 1 to 2 nm. Furthermore, when the current density of the MR element 5 exceeds $1 \times 10^8$ A/cm² with a voltage of 100 mV applied to the MR element 5, the effects of spin torque on the magnetization of the pinned layer 23 become noticeable, which causes a reduction in the exchange coupling magnetic field of the pinned layer 23. For this reason, it is preferred that the current density be $1 \times 10^8$ A/cm² or lower.

Furthermore, when the resistance-area product of the MR element 5 is within a range of 0.12 to 0.3Ω·μm², the MR ratio is higher than 10%. Therefore, it is more preferable that the resistance-area product of the MR element 5 be within the range of 0.12 to 0.3Ω·μm² and the conductivity of the spacer layer 24 be within in a range of 133 to 344 S/cm. In addition, when the oxide semiconductor used for the semiconductor layer 42 is ZnO, it is more preferable that the thickness of the semiconductor layer 42 be within a range of 1.2 to 2 nm in order to allow the resistance-area product of the MR element 5 to fall within the range of 0.12 to 0.3Ω·μm².

Furthermore, when the resistance-area product of the MR element 5 is within a range of 0.2 to 0.3Ω·μm², the MR ratio is 12% or higher. Therefore, it is more preferable that the resistance-area product of the MR element 5 be within the range of 0.2 to 0.3Ω·μm² and the conductivity of the spacer layer 24 be within in a range of 133 to 193 S/cm. In addition, when the oxide semiconductor used for the semiconductor layer 42 is ZnO, it is more preferable that the thickness of the semiconductor layer 42 be within a range of 1.6 to 2 nm in order to allow the resistance-area product of the MR element 5 to fall within the range of 0.2 to 0.3Ω·μm².

In the first experiment described previously, the oxide semiconductor used for the semiconductor layer 42 is ZnO, and the material of the nonmagnetic metal layers 41 and 43 is Cu. However, the aforementioned respective preferable ranges of the resistance-area product of the MR element 5 and the conductivity of the spacer layer 24 also apply to cases other than the case where the oxide semiconductor used for the semiconductor layer 42 is ZnO and the nonmagnetic metal layers 41 and 43 are made of Cu. Even in cases other than the case where the oxide semiconductor used for the semiconductor layer 42 is ZnO and the nonmagnetic metal layers 41 and 43 are made of Cu, it is possible to make the resistance-area product of the MR element 5 and the conductivity of the spacer layer 24 fall within the aforementioned respective preferable ranges by properly controlling the thickness of the semiconductor layer 42. It is thereby possible to obtain a high MR ratio in the MR element 5 while suppressing head noise and the effects of spin torque.

Descriptions will now be provided on the reason why the conductivity of the spacer layer 24 is specified in the present invention. To begin with, conductivity is expressed by the electric charge of a carrier multiplied by the carrier density and the mobility. However, it is difficult to determine the carrier density and the mobility of each material constituting the MR element 5. Furthermore, since the layers making up the MR element 5 are very thin, the carrier density and the mobility of each layer vary depending on the thickness of the layer. Accordingly, it is physically meaningless to specify values of the carrier density and the mobility of each of the layers making up the MR element 5 in order to identify an MR element 5 which provides preferable resistance-area product and MR ratio.

For the spacer layer 24, the magnitude of carrier density represents how large in number the conductive electrons are, while the magnitude of mobility represents how easy for electrons to move. The magnitude of mobility in the spacer layer 24 is associated with film quality such as the crystallinity of the spacer layer 24.

For example, suppose that the semiconductor layer 42 in the spacer layer 24 is a ZnO film and this ZnO film is thin. In this case, the film formation would complete at an early growth stage of the film, and therefore the ZnO film would include a portion in which the crystallinity is not good. This results in a reduction in mobility in the ZnO film. When the crystallinity of the ZnO film is not good, the carrier density of the ZnO film is increased due to oxygen deficiency and/or the behavior of interstitial Zn atoms. When the thickness of the ZnO film is less than 1 nm, in particular, the crystallinity of the ZnO film is poor and therefore the ZnO film functions as a conductor. This results in an excessive reduction in resistance-area product of the MR element 5. Furthermore, when the thickness of the ZnO film is less than 1 nm, since the mobility in the ZnO film is low, the spin-polarized electrons are readily scattered in the ZnO film, and as a result, it is not possible to obtain a high MR ratio.

On the other hand, when the ZnO film is thick, the crystallinity of the ZnO film is better than that in the case where the ZnO film is thin, and the mobility in the ZnO film therefore increases. However, since defects in the ZnO crystal are reduced in number, the carrier density decreases. When the thickness of the ZnO film is greater than 2 nm, in particular, the carrier density is excessively reduced and it becomes impossible to allow conduction of the spin-polarized electrons in the ZnO film. As a result, the MR ratio is reduced.

As described above, if the thickness of the semiconductor layer 42 changes, the carrier density and the mobility in the semiconductor layer 42 both change. Accordingly, it is physically meaningless to specify values of the carrier density and the mobility in the semiconductor layer 42 in order to identify an MR element 5 which provides preferable resistance-area product and MR ratio. On the other hand, the conductivity of the spacer layer 24 depends on the carrier density and the mobility in the semiconductor layer 42 and the thickness of the semiconductor layer 42. In other words, the conductivity of the spacer layer 24 reflects the carrier density and the mobility in the semiconductor layer 42 and the thickness of the semiconductor layer 42. Accordingly, controlling the conductivity of the spacer layer 24 and further the thickness of the semiconductor layer 42 in order to provide an MR element 5 that achieves preferable resistance-area product and MR ratio can be said to mean that the carrier density and mobility in the semiconductor layer 42 and the thickness of the semiconductor layer 24 are collectively controlled. By controlling the conductivity of the spacer layer 24 and further the thickness of the semiconductor layer 42 as thus described, it is possible to provide an MR element 5 that achieves preferable resistance-area product and MR ratio.

Descriptions will now be provided on the second experiment mentioned previously. In the second experiment, 11 types of MR element samples labeled as types 1 to 11 were prepared for different heat treatment conditions, and then the resistance-area product ($\Omega \cdot \mu m^2$) and MR ratio (%) of these samples (MR elements) were determined. The film configuration of the MR elements of the types 1 to 11 was the same as that of the samples 1 to 11 of the first experiment. Four types of heat treatment conditions were provided, i.e., "No heat treatment", "Heat treatment at 180° C.", "Heat treatment at 210° C.", and "Heat treatment at 250° C.". Each heat treatment was carried out for 5 hours in a vacuum of $1.0 \times 10^{-4}$ Pa or less. Therefore, the samples of the types 1 to 11 prepared under the condition of "Heat treatment at 250° C." are the same as the samples 1 to 11 of the first experiment. The results of the second experiment are shown in Table 4 below. Note that in Table 4 "thickness" represents the thickness of the semiconductor layer 42. In addition, the resistance-area product in Table 4 is expressed in $\Omega \cdot \mu m^2$.

TABLE 4

| Type | Thickness (nm) | Heat treatment at 250° C. | | No heat treatment | | Heat treatment at 180° C. | | Heat treatment at 210° C. | |
|---|---|---|---|---|---|---|---|---|---|
| | | Resistance-area product | MR ratio (%) | Resistance-area product | MR ratio (%) | Resistance-area product | MR ratio (%) | Resistance-area product | MR ratio (%) |
| 1 | 0 | 0.045 | 3.3 | 0.06 | 0.9 | 0.05 | 1.0 | 0.045 | 2.0 |
| 2 | 0.5 | 0.06 | 5.0 | 0.2 | 1.0 | 0.14 | 1.2 | 0.08 | 4.0 |
| 3 | 0.8 | 0.07 | 8.0 | 0.5 | 1.0 | 0.3 | 3.0 | 0.09 | 8.0 |
| 4 | 1.0 | 0.1 | 10.0 | 0.9 | 1.4 | 0.5 | 5.0 | 0.1 | 10.0 |
| 5 | 1.2 | 0.12 | 10.8 | 1.5 | 2.5 | 0.7 | 5.5 | 0.14 | 10.5 |
| 6 | 1.4 | 0.14 | 11.0 | 2.0 | 3.0 | 1.0 | 6.5 | 0.16 | 10.5 |
| 7 | 1.6 | 0.2 | 14.0 | 3.0 | 3.0 | 1.4 | 7.0 | 0.2 | 12.0 |
| 8 | 1.8 | 0.25 | 16.0 | 4.5 | 2.0 | 1.6 | 8.0 | 0.25 | 14.0 |
| 9 | 2.0 | 0.3 | 12.0 | 6.0 | 1.5 | 2.0 | 6.5 | 0.3 | 10.0 |
| 10 | 2.2 | 0.35 | 10.0 | 6.5 | 1.0 | 2.3 | 4.0 | 0.36 | 9.0 |
| 11 | 3.5 | 0.6 | 3.5 | 7.0 | 0.9 | 5.0 | 2.0 | 0.7 | 3.0 |

Discussions will now be provided on the relationship between the heat treatment and each of the resistance-area product and the MR ratio for the samples of the types 2 to 11 having the semiconductor layer 42. In the case of "No heat treatment", the resistance-area product is approximately 10 to 20 times greater and the MR ratio is extremely lower as compared with the case of "Heat treatment at 250° C.". In the case of "Heat treatment at 180° C.", the resistance-area product is smaller and the MR ratio is higher as compared with the case of "No heat treatment", but the resistance-area product is higher and the MR ratio is lower as compared with the case of "Heat treatment at 250° C.". In the case of "Heat treatment at 210° C.", the resistance-area product and the MR ratio are equivalent to those obtained in the case of "Heat treatment at 250° C.".

As can be seen from the second experiment, in the case where the first nonmagnetic metal layer 41, the semiconductor layer 42 and the second nonmagnetic metal layer 43 are simply formed to constitute the spacer layer 24, the resistance-area product will be excessively great and it is not possible to obtain a high MR ratio. In contrast, in the case where the first nonmagnetic metal layer 41, the semiconductor layer 42 and the second nonmagnetic metal layer 43 are formed and thereafter heat treatment is given to these layers to form the spacer layer 24, it is possible to reduce the resistance-area product to an appropriate value and to obtain a high MR ratio. Thus, the heat treatment serves to reduce the resistance-area product. This is presumably because the heat treatment causes rearrangement of atoms at the interface between the first nonmagnetic metal layer 41 and the semiconductor layer 42, and at the interface between the semiconductor layer 42 and the second nonmagnetic metal layer 43, and as a result, the conductivity of the spacer layer 24 is increased as shown in Table 3.

Several experiments similar to the second experiment were carried out with different temperatures of heat treatment. As a result, it was found that a resistance-area product within the range of 0.1 to $0.3\Omega\cdot\mu m^2$ was obtainable by performing heat treatment at a temperature of 200° C. or higher. It was also found that the resistance-area product did not vary much with varying duration of heat treatment.

However, in a case where the MR element 5 is to be used for a read head, performing heat treatment at temperatures higher than 300° C. causes a problem that the crystal of the first shield layer 3 overgrows to thereby cause a reduction in magnetic permeability of the first shield layer 3. This is indicated by a third experiment, which will now be described. In the third experiment, the relationship between the temperature of heat treatment and each of the crystal grain diameter of the first shield layer 3 after heat treatment and the rate of occurrences of hysteresis jump in the first shield layer 3 after heat treatment was studied. In this experiment, the first shield layer 3 was a NiFe layer. The crystal grain diameter of the first shield layer 3 was determined by the Scherrer equation from the half-width of the X-ray diffraction pattern of the (111) plane in the face-centered cubic structure of the NiFe layer. The hysteresis jump refers to a discontinuous change that occurs in a QST (quasi-static test) curve obtained by a quasi-static test. The rate of occurrences of hysteresis jump was determined by carrying out the quasi-static test on 100 samples. Hysteresis jumps occurring in the first shield layer 3 cause variations in the output of the read head and/or deformations of the waveform of read signals. For this reason, a higher rate of occurrences of hysteresis jump in the first shield layer 3 results in a reduction in the yield of the read head. The results of the third experiment are shown in Table 5 below.

TABLE 5

| Temperature of heat treatment (° C.) | Crystal grain diameter (nm) | Rate of occurrences of hysteresis jump (%) |
| --- | --- | --- |
| 270 | 50 | 0 |
| 280 | 92 | 0 |
| 290 | 125 | 1 |
| 300 | 600 | 3 |
| 320 | 735 | 36 |
| 340 | 1005 | 53 |
| 350 | 1200 | 98 |

As can be seen from Table 5, the rate of occurrences of hysteresis jump is sufficiently low when the temperature of heat treatment is 300° C. or lower. In contrast, the rate of occurrences of hysteresis jump becomes higher when the temperature of heat treatment exceeds 300° C. Accordingly, in the case of using the MR element 5 for a read head, it is preferred that the temperature of heat treatment be 300° C. or lower.

The same effects as those provided by the aforementioned heat treatment can also be obtained by plasma treatment or illumination with high-energy beams of light.

Descriptions will now be provided on the fourth experiment mentioned previously. In this experiment, 6 types of MR element samples numbered 21 to 26 were prepared, and then the resistance-area product ($\Omega\cdot\mu m^2$) and MR ratio (%) of these samples (MR elements) were determined. The film configuration of the samples 21 to 26 was the same as that of the MR element 5 of the embodiment shown in FIG. 1. The specific film configuration of the samples 21 to 26 is shown in Table 6 below. For the samples 21 to 26, as shown in Table 6, the semiconductor layer 42 is made of ZnO, and the first nonmagnetic metal layer 41 and the second nonmagnetic metal layer 43 are made of Cu. In each of the samples 21 to 26, the thickness T1 of the first nonmagnetic metal layer 41 and the thickness T3 of the second nonmagnetic metal layer 43 are equal. The thicknesses T1 and T3 of the nonmagnetic metal layers 41 and 43 are different among the samples. The shape of the samples and the ways of determining the resistance-area product and MR ratio in the fourth experiment are the same as those of the first experiment. The results of the fourth experiment are shown in Table 7.

TABLE 6

| | Layer | Substance | Thickness (nm) |
| --- | --- | --- | --- |
| | Protection layer | Ta | 2 |
| | | Ru | 13 |
| | Free layer | CoFe | 4 |
| Spacer layer | Second nonmagnetic metal layer | Cu | T3 |
| | Semiconductor layer | ZnO | 1.4 |
| | First nonmagnetic metal layer | Cu | T1 |
| Pinned layer | Inner layer | CoFe | 5.5 |
| | Nonmagnetic middle layer | Ru | 0.8 |
| | Outer layer | CoFe | 5 |
| | Antiferromagnetic layer | IrMn | 5.5 |
| | Underlying layer | Ru | 2 |
| | | Ta | 1 |

TABLE 7

| Sample | T1, T3 (nm) | Resistance-area product ($\Omega\cdot\mu m^2$) | MR ratio (%) |
| --- | --- | --- | --- |
| 21 | 0.2 | 0.32 | 9.2 |
| 22 | 0.3 | 0.2 | 14.0 |
| 23 | 0.7 | 0.14 | 11.0 |
| 24 | 2.0 | 0.14 | 10.0 |
| 25 | 2.2 | 0.13 | 9.5 |
| 26 | 2.5 | 0.13 | 9.0 |

As can be seen from Table 7, the MR ratio decreases when the thickness of each of the nonmagnetic metal layers 41 and 43 is less than 0.3 nm. This is presumably because, when the thickness of each of the nonmagnetic metal layers 41 and 43 is less than 0.3 nm, the nonmagnetic metal layers 41 and 43 would not grow continuously but rather become island-shaped, and this would result in a state in which the metal and the semiconductor are both present in a cross section near the interface between the semiconductor layer 42 and the nonmagnetic metal layers 41, 43, thereby causing the spin-polarized electrons to be easily scattered. The MR ratio also decreases when the thickness of each of the nonmagnetic metal layers 41 and 43 is greater than 2 nm. This is presumably because scattering of the spin-polarized electrons noticeably occurs in the nonmagnetic metal layers 41 and 43. In view of these, it is preferred that the thickness of each of the nonmagnetic metal layers 41 and 43 be within a range of 0.3 to 2 nm. This preferable thickness range of the nonmagnetic metal layers 41 and 43 also applies to cases where the nonmagnetic metal layers 41 and 43 are made of a material other than Cu. The thicknesses of the nonmagnetic metal layer 41 and the nonmagnetic metal layer 43 can be equal to or different from each other as long as each of them is within the range of 0.3 to 2 nm.

According to the embodiment, by allowing the thicknesses of the semiconductor layer 42 and the nonmagnetic metal layers 41 and 43 to fall within their respective preferable ranges mentioned above, it is possible to achieve a higher MR ratio as compared with a typical CPP-GMR element in which the spacer layer is made up only of a nonmagnetic metal layer. This can be seen from, for example, a comparison between the MR ratio of the sample 1 having no semiconductor layer 42 and the MR ratios of the samples 4 to 9 and 22 to 25 in each of which the semiconductor layer 42 is present and the thicknesses of the semiconductor layer 42 and the nonmagnetic metal layers 41 and 43 fall within their respective preferable ranges. In the embodiment, the thicknesses of the layers 41 to 43 fall within their respective preferable ranges. It is assumed that this makes it possible to suppress scattering of spin-polarized electrons in the layers 41 to 43 and thereby contributes to an increase in MR ratio.

Figure 4:
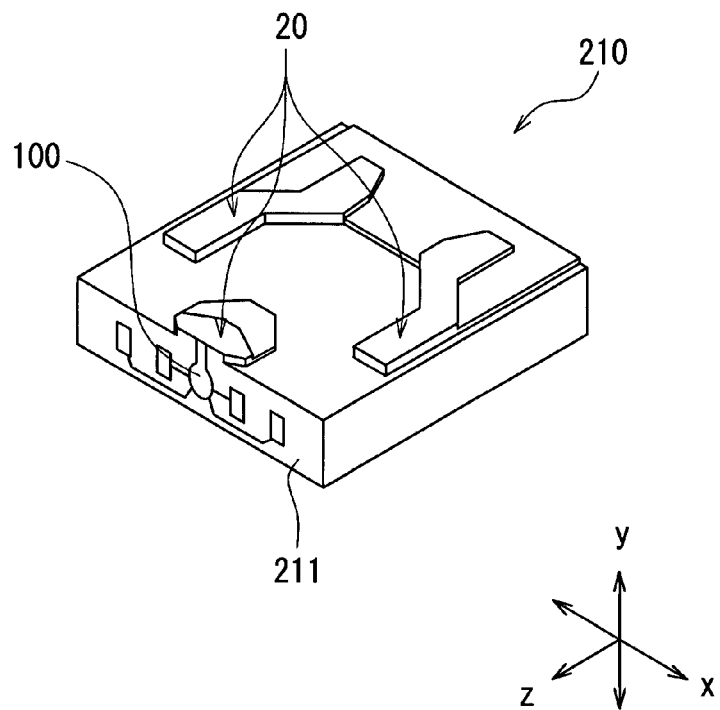
FIG. 4 is a perspective view illustrating a slider incorporated in a head gimbal assembly of the embodiment of the invention.

A head gimbal assembly, a head arm assembly and a magnetic disk drive of the embodiment will now be described. Reference is now made to FIG. 4 to describe a slider 210 incorporated in the head gimbal assembly. In the magnetic disk drive, the slider 210 is placed to face toward a magnetic disk platter that is a circular-plate-shaped recording medium to be driven to rotate. The slider 210 has a base body 211 made up mainly of the substrate 1 and the overcoat layer 17 of FIG. 2. The base body 211 is nearly hexahedron-shaped. One of the six surfaces of the base body 211 faces toward the magnetic disk platter. The medium facing surface 20 is formed in this one of the surfaces. When the magnetic disk platter rotates in the z direction of FIG. 4, an airflow passes between the magnetic disk platter and the slider 210, and a lift is thereby generated below the slider 210 in the y direction of FIG. 4 and exerted on the slider 210. The slider 210 flies over the surface of the magnetic disk platter by means of the lift. The x direction of FIG. 4 is across the tracks of the magnetic disk platter. The thin-film magnetic head 100 of the embodiment is formed near the air-outflow-side end (the end located at the lower left of FIG. 4) of the slider 210.

Figure 5:
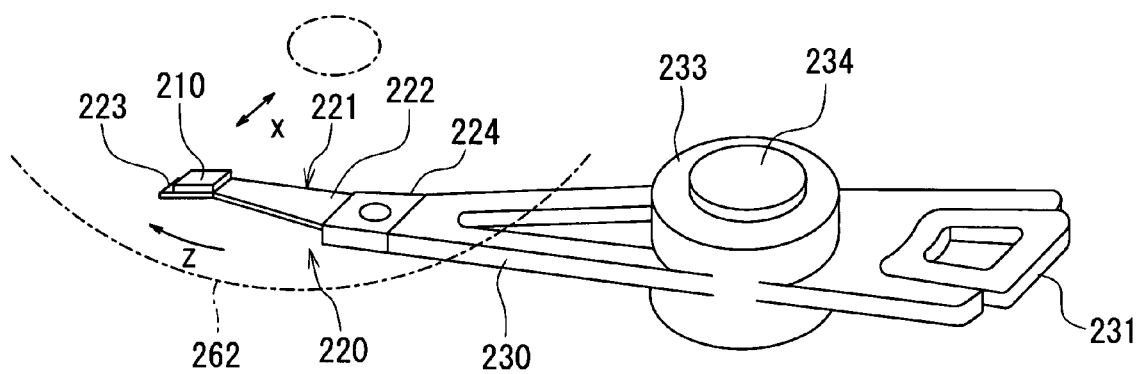
FIG. 5 is a perspective view illustrating a head arm assembly of the embodiment of the invention.

Reference is now made to FIG. 5 to describe the head gimbal assembly 220 of the embodiment. The head gimbal assembly 220 includes the slider 210 and a suspension 221 that flexibly supports the slider 210. The suspension 221 includes: a plate-spring-shaped load beam 222 made of stainless steel, for example; a flexure 223 to which the slider 210 is joined, the flexure 223 being located at an end of the load beam 222 and giving an appropriate degree of freedom to the slider 210; and a base plate 224 located at the other end of the load beam 222. The base plate 224 is attached to an arm 230 of an actuator for moving the slider 210 along the x direction across the tracks of the magnetic disk platter 262. The actuator incorporates the arm 230 and a voice coil motor that drives the arm 230. A gimbal section for maintaining the orientation of the slider 210 is provided in the portion of the flexure 223 on which the slider 210 is mounted.

The head gimbal assembly 220 is attached to the arm 230 of the actuator. An assembly having the arm 230 and the head gimbal assembly 220 attached to the arm 230 is called a head arm assembly. An assembly having a carriage with a plurality of arms wherein the head gimbal assembly 220 is attached to each of the arms is called a head stack assembly.

FIG. 5 illustrates the head arm assembly of the embodiment. In the head arm assembly, the head gimbal assembly 220 is attached to an end of the arm 230. A coil 231 that is part of the voice coil motor is fixed to the other end of the arm 230. A bearing 233 is provided in the middle of the arm 230. The bearing 233 is attached to a shaft 234 that rotatably supports the arm 230.

Figure 6:
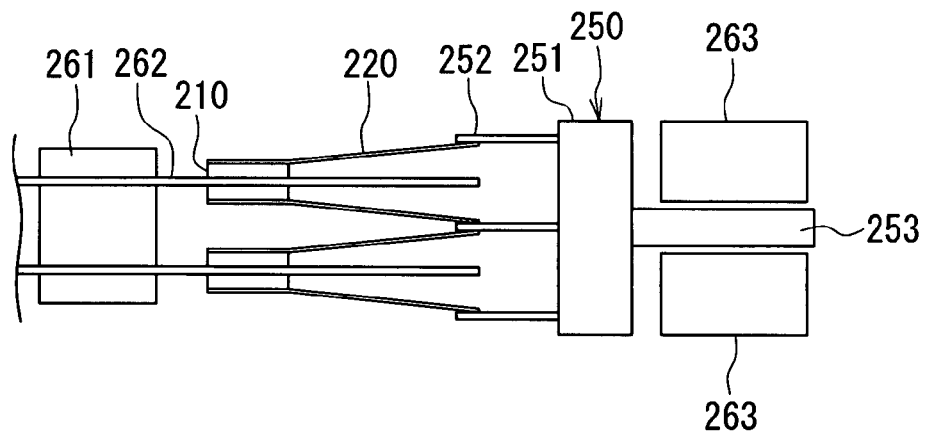
FIG. 6 is a view for illustrating the main part of a magnetic disk drive of the embodiment of the invention.
Figure 7:
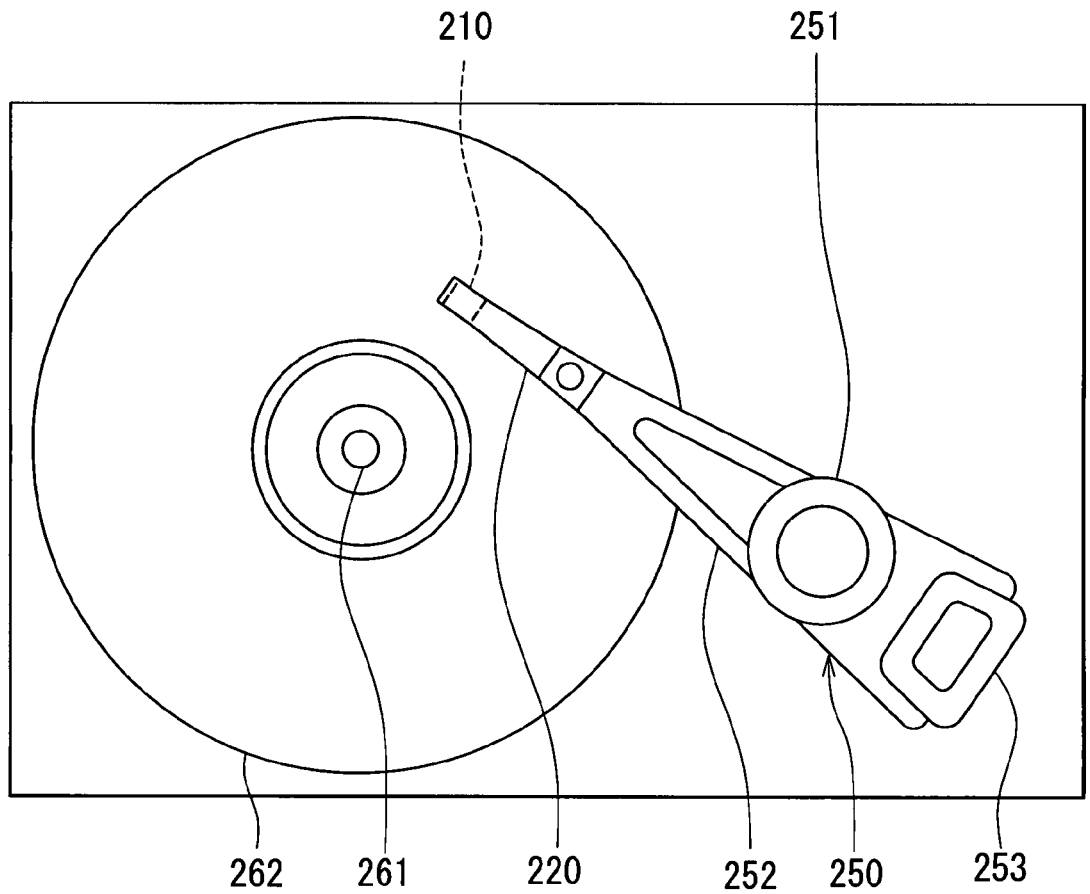
FIG. 7 is a top view of the magnetic disk drive of the embodiment of the invention.

Reference is now made to FIG. 6 and FIG. 7 to describe an example of the head stack assembly and the magnetic disk drive of the embodiment. FIG. 6 illustrates the main part of the magnetic disk drive. FIG. 7 is a top view of the magnetic disk drive. The head stack assembly 250 incorporates a carriage 251 having a plurality of arms 252. A plurality of head gimbal assemblies 220 are attached to the arms 252 such that the assemblies 220 are aligned in the vertical direction with spacing between adjacent ones. A coil 253 that is part of the voice coil motor is mounted on the carriage 251 on a side opposite to the arms 252. The head stack assembly 250 is installed in the magnetic disk drive. The magnetic disk drive includes a plurality of magnetic disk platters 262 mounted on a spindle motor 261. Two of the sliders 210 are allocated to each of the platters 262, such that the two sliders 210 are opposed to each other with each of the platters 262 disposed in between. The voice coil motor includes permanent magnets 263 disposed to be opposed to each other, the coil 253 of the head stack assembly 250 being placed between the magnets 263.

The actuator and the head stack assembly 250 except the sliders 210 correspond to the alignment device of the invention and support the sliders 210 and align them with respect to the magnetic disk platters 262.

In the magnetic disk drive of the embodiment, the actuator moves the slider 210 across the tracks of the magnetic disk platter 262 and aligns the slider 210 with respect to the magnetic disk platter 262. The thin-film magnetic head incorporated in the slider 210 writes data on the magnetic disk platter 262 through the use of the write head and reads data stored on the magnetic disk platter 262 through the use of the read head.

The head gimbal assembly, the head arm assembly and the magnetic disk drive of the embodiment exhibit effects similar to those of the foregoing thin-film magnetic head of the embodiment.

The present invention is not limited to the foregoing embodiment but various modifications can be made thereto. For example, the pinned layer 23 is not limited to a synthetic pinned layer. In addition, in the embodiment, descriptions have been made on the thin-film magnetic head having such a configuration that the read head is formed on the base body and the write head is stacked on the read head; however, the read and write heads may be stacked in the reverse order.

Furthermore, when used only for read operations, the thin-film magnetic head may be configured to include only the read head.

From the foregoing descriptions, it is apparent that various aspects and modifications of the present invention can be implemented. Accordingly, within the scope equivalent to that of the claims set forth below, the present invention can be carried out in embodiments other than the foregoing most preferred embodiment.

What is claimed is:

1. A magnetoresistive element comprising:
   a free layer having a direction of magnetization that changes in response to an external magnetic field;
   a pinned layer having a fixed direction of magnetization; and
   a spacer layer disposed between the free layer and the pinned layer,
   wherein a current for detecting magnetic signals is fed in a direction intersecting a plane of each of the foregoing layers, and wherein:
   the spacer layer includes: first and second nonmagnetic metal layers each of which is made of Cu; and a semiconductor layer that is made of a material containing zinc oxide which is an oxide semiconductor, the semiconductor layer being disposed between the first nonmagnetic metal layer and the second nonmagnetic metal layer;

the magnetoresistive element has a resistance-area product within a range of 0.1 to 0.3 $\Omega \cdot \mu m^2$; and the spacer layer has a conductivity within a range of 133 to 432 S/cm.

2. The magnetoresistive element according to claim 1, wherein the resistance-area product is within a range of 0.12 to 0.3 $\Omega \cdot \mu m^2$.

3. The magnetoresistive element according to claim 1, wherein the resistance-area product is within a range of 0.2 to 0.3 $\Omega \cdot \mu m^2$.

4. The magnetoresistive element according to claim 1, wherein the semiconductor layer has a thickness within a range of 1 to 2 nm.

5. The magnetoresistive element according to claim 1, wherein the semiconductor layer has a thickness within a range of 1.2 to 2 nm.

6. The magnetoresistive element according to claim 1, wherein the semiconductor layer has a thickness within a range of 1.6 to 2 nm.

7. The magnetoresistive element according to claim 1, wherein each of the first and second nonmagnetic metal layers has a thickness within a range of 0.3 to 2 nm.

8. A thin-film magnetic head comprising: a medium facing surface that faces toward a recording medium; a magnetoresistive element disposed near the medium facing surface to detect a signal magnetic field sent from the recording medium; and a pair of electrodes for feeding a current for detecting magnetic signals to the magnetoresistive element, the magnetoresistive element comprising:

a free layer having a direction of magnetization that changes in response to an external magnetic field;

a pinned layer having a fixed direction of magnetization; and a spacer layer disposed between the free layer and the pinned layer, wherein:

in the magnetoresistive element, the current for detecting magnetic signals is fed in a direction intersecting a plane of each of the foregoing layers;

the spacer layer includes: first and second nonmagnetic metal layers each of which is made of Cu; and a semiconductor layer that is made of a material containing zinc oxide which is an oxide semiconductor, the semiconductor layer being disposed between the first nonmagnetic metal layer and the second nonmagnetic metal layer;

the magnetoresistive element has a resistance-area product within a range of 0.1 to 0.3 $\Omega \cdot \mu m^2$; and the spacer layer has a conductivity within a range of 133 to 432 S/cm.

9. A head gimbal assembly comprising: a slider including a thin-film magnetic head and disposed to face toward a recording medium; and a suspension flexibly supporting the slider, the thin-film magnetic head comprising: a medium facing surface that faces toward the recording medium; a magnetoresistive element disposed near the medium facing surface to detect a signal magnetic field sent from the recording medium; and a pair of electrodes for feeding a current for detecting magnetic signals to the magnetoresistive element, the magnetoresistive element comprising:

a free layer having a direction of magnetization that changes in response to an external magnetic field;

a pinned layer having a fixed direction of magnetization; and a spacer layer disposed between the free layer and the pinned layer, wherein:

in the magnetoresistive element, the current for detecting magnetic signals is fed in a direction intersecting a plane of each of the foregoing layers;

the spacer layer includes: first and second nonmagnetic metal layers each of which is made of Cu; and a semiconductor layer that is made of a material containing zinc oxide which is an oxide semiconductor, the semiconductor layer being disposed between the first nonmagnetic metal layer and the second nonmagnetic metal layer;

the magnetoresistive element has a resistance-area product within a range of 0.1 to 0.3 $\Omega \cdot \mu m^2$; and the spacer layer has a conductivity within a range of 133 to 432 S/cm.

10. A head arm assembly comprising: a slider including a thin-film magnetic head and disposed to face toward a recording medium; a suspension flexibly supporting the slider; and an arm for making the slider travel across tracks of the recording medium, the suspension being attached to the arm, the thin-film magnetic head comprising: a medium facing surface that faces toward the recording medium; a magnetoresistive element disposed near the medium facing surface to detect a signal magnetic field sent from the recording medium; and a pair of electrodes for feeding a current for detecting magnetic signals to the magnetoresistive element, the magnetoresistive element comprising:

a free layer having a direction of magnetization that changes in response to an external magnetic field;

a pinned layer having a fixed direction of magnetization; and a spacer layer disposed between the free layer and the pinned layer, wherein:

in the magnetoresistive element, the current for detecting magnetic signals is fed in a direction intersecting a plane of each of the foregoing layers;

the spacer layer includes: first and second nonmagnetic metal layers each of which is made of Cu; and a semiconductor layer that is made of a material containing zinc oxide which is an oxide semiconductor, the semiconductor layer being disposed between the first nonmagnetic metal layer and the second nonmagnetic metal layer;

the magnetoresistive element has a resistance-area product within a range of 0.1 to 0.3 $\Omega \cdot \mu m^2$; and the spacer layer has a conductivity within a range of 133 to 432 S/cm.

11. A magnetic disk drive comprising: a slider including a thin-film magnetic head and disposed to face toward a recording medium that is driven to rotate; and an alignment device supporting the slider and aligning the slider with respect to the recording medium, the thin-film magnetic head comprising: a medium facing surface that faces toward the recording medium; a magnetoresistive element disposed near the medium facing surface to detect a signal magnetic field sent from the recording medium; and a pair of electrodes for feeding a current for detecting magnetic signals to the magnetoresistive element, the magnetoresistive element comprising:

a free layer having a direction of magnetization that changes in response to an external magnetic field;

a pinned layer having a fixed direction of magnetization; and a spacer layer disposed between the free layer and the pinned layer, wherein:

in the magnetoresistive element, the current for detecting magnetic signals is fed in a direction intersecting a plane of each of the foregoing layers;

the spacer layer includes: first and second nonmagnetic metal layers each of which is made of Cu; and a semiconductor layer that is made of a material containing zinc oxide which is an oxide semiconductor, the semiconductor layer being disposed between the first nonmagnetic metal layer and the second nonmagnetic metal layer;

the magnetoresistive element has a resistance-area product within a range of 0.1 to 0.3 $\Omega \cdot \mu m^2$; and the spacer layer has a conductivity within a range of 133 to 432 S/cm.

* * * * *